United States Patent
Lee et al.

(10) Patent No.: US 12,400,911 B2
(45) Date of Patent: Aug. 26, 2025

(54) SEMICONDUCTOR DEVICE AND METHOD FOR FABRICATING THEREOF

(71) Applicant: Samsung Electronics Co., Ltd., Suwon-si (KR)

(72) Inventors: Jong Jin Lee, Seoul (KR); Seung Yong Yoo, Incheon (KR); Eun-Ji Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 291 days.

(21) Appl. No.: 17/933,216

(22) Filed: Sep. 19, 2022

(65) Prior Publication Data
US 2023/0170252 A1    Jun. 1, 2023

(30) Foreign Application Priority Data
Dec. 1, 2021   (KR) .................. 10-2021-0169761

(51) Int. Cl.
*H01L 21/768*  (2006.01)
*H01L 23/522*  (2006.01)
*H01L 23/532*  (2006.01)
*H10D 64/66*  (2025.01)

(52) U.S. Cl.
CPC .. *H01L 21/76811* (2013.01); *H01L 21/76877* (2013.01); *H01L 23/5226* (2013.01); *H01L 23/53266* (2013.01); *H10D 64/671* (2025.01)

(58) Field of Classification Search
CPC combination set(s) only.
See application file for complete search history.

(56) References Cited

U.S. PATENT DOCUMENTS

| | | | |
|---|---|---|---|
| 7,727,888 B2 | 6/2010 | Yang et al. |
| 8,354,751 B2 | 1/2013 | Horak et al. |
| 9,349,691 B2 | 5/2016 | Murray et al. |
| 9,691,659 B1 | 6/2017 | Mignot et al. |
| 10,879,107 B2 | 12/2020 | Dutta et al. |

(Continued)

FOREIGN PATENT DOCUMENTS

| | | | |
|---|---|---|---|
| EP | 3493247 A1 | 6/2019 |
| WO | 2012087714 A2 | 6/2012 |

OTHER PUBLICATIONS

European Search Report corresponding to European Application No. 22193825.1 (4 pages) (May 3, 2023).

(Continued)

*Primary Examiner* — Thanhha S Pham
(74) *Attorney, Agent, or Firm* — Myers Bigel, P.A.

(57) ABSTRACT

The present disclosure provides a semiconductor device capable of improving element performance and reliability. The semiconductor device comprises a lower wiring structure, an upper interlayer insulating layer disposed on the lower wiring structure and including an upper wiring trench, the upper wiring trench exposing a portion of the lower wiring structure, and an upper wiring structure including an upper liner and an upper filling layer on the upper liner in the upper wiring trench, wherein the upper liner includes a sidewall portion extending along a sidewall of the upper wiring trench and a bottom portion extending along a bottom surface of the upper wiring trench, the sidewall portion of the upper liner includes cobalt (Co) and ruthenium (Ru), and the bottom portion of the upper liner is formed of cobalt (Co).

20 Claims, 29 Drawing Sheets

(56) References Cited

U.S. PATENT DOCUMENTS

| | | |
|---|---|---|
| 2009/0246952 A1 | 10/2009 | Ishizaka et al. |
| 2010/0078818 A1 | 4/2010 | Ishizaka et al. |
| 2010/0295181 A1 | 11/2010 | Yang et al. |
| 2018/0053725 A1* | 2/2018 | Edelstein ............ H01L 21/3212 |
| 2018/0158781 A1 | 6/2018 | Jung et al. |
| 2019/0221477 A1 | 7/2019 | Amanapu et al. |
| 2020/0105592 A1 | 4/2020 | Kuo et al. |

OTHER PUBLICATIONS

European Office Action corresponding to European Application No. 22193825.1 (8 pages) (May 16, 2023).

\* cited by examiner

SEMICONDUCTOR DEVICE AND METHOD FOR FABRICATING THEREOF

CROSS-REFERENCE TO RELATED APPLICATION

This application claims priority from Korean Patent Application No. 10-2021-0169761 filed on Dec. 1, 2021 in the Korean Intellectual Property Office, and all the benefits accruing therefrom under 35 U.S.C. 119, the contents of which in its entirety are herein incorporated by reference.

FIELD

The present disclosure relates to a semiconductor device and a method for fabricating the same, and more particularly, to a semiconductor element including a wiring line formed in a back-end-of-line (BEOL) process, and a method for fabricating the same.

BACKGROUND

Due to the development of electronic technology, as down-scaling of semiconductor devices is rapidly progressing, high integration and low power consumption of semiconductor chips may be required. In order to respond to demand for high integration and low power consumption of the semiconductor chips, feature sizes of semiconductor devices are decreasing.

On the other hand, as the feature size decreases, various studies are being conducted on a stable connection method between wirings.

SUMMARY

Aspects of the present disclosure provide a semiconductor device capable of improving performance and reliability of an element.

Aspects of the present disclosure provide a method for fabricating a semiconductor device capable of improving performance and reliability of an element.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a lower wiring structure, an upper interlayer insulating layer on the lower wiring structure and including an upper wiring trench that vertically overlaps a portion of the lower wiring structure, and an upper wiring structure including an upper liner and an upper filling layer on the upper liner in the upper wiring trench, wherein the upper liner includes a sidewall portion extending along a sidewall of the upper wiring trench and a bottom portion extending along a bottom surface of the upper wiring trench, the sidewall portion of the upper liner includes cobalt (Co) and ruthenium (Ru), and the bottom portion of the upper liner is formed of cobalt (Co).

According to another aspect of the present disclosure, there is provided a semiconductor device comprising a lower wiring structure, an upper interlayer insulating layer on the lower wiring structure and including an upper wiring trench, the upper wiring trench including an upper wiring line trench and an upper via trench on a bottom surface of the upper wiring line trench, and a bottom surface of the upper via trench comprises the lower wiring structure, and an upper wiring structure including an upper barrier layer, an upper filling layer, and an upper liner between the upper barrier layer and the upper filling layer in the upper wiring trench, wherein the upper barrier layer extends along a sidewall and a bottom surface of the upper wiring line trench and a sidewall of the upper via trench, the upper barrier layer comprises a metal nitride, the upper liner includes a sidewall portion extending along the sidewall and the bottom surface of the upper wiring line trench and along the sidewall of the upper via trench, and a bottom portion extending along a bottom surface of the upper via trench, the upper liner is in contact with the lower wiring structure, the upper liner includes cobalt (Co) and ruthenium (Ru), and the sidewall portion of the upper liner has a component or composition different from that of the bottom portion of the upper liner.

According to still another aspect of the present disclosure, there is provided a semiconductor device comprising a lower wiring structure, an upper interlayer insulating layer on the lower wiring structure and including an upper wiring trench, the upper wiring trench exposing a portion of the lower wiring structure, and an upper wiring structure including an upper liner and an upper filling layer on the upper liner in the upper wiring trench, wherein the upper liner is in contact with the lower wiring structure, the upper liner includes a sidewall portion extending along a sidewall of the upper wiring trench and a bottom portion extending along a bottom surface of the upper wiring trench, the sidewall portion of the upper liner includes a first portion including a ruthenium-cobalt (RuCo) alloy layer, and a second portion formed of cobalt (Co), the second portion of the sidewall portion of the upper liner is in contact with the lower wiring structure, and the bottom portion of the upper liner is formed of cobalt (Co).

According to still another aspect of the present disclosure, there is provided a method for fabricating a semiconductor device, the method comprising forming a lower wiring structure; forming an upper interlayer insulating layer comprising an upper wiring trench on the lower wiring structure, the upper wiring trench exposing a first region of the lower wiring structure; forming a first selective suppression layer on the first region of the lower wiring structure exposed by the upper wiring trench; forming an upper barrier layer along a sidewall of the upper wiring trench in a state in which the first selective suppression layer is formed, wherein a bottom surface of the upper wiring trench is free of the upper barrier; exposing a second region of the lower wiring structure by removing the first selective suppression layer; forming a second selective suppression layer on the second region of the lower wiring structure that was exposed; forming a ruthenium (Ru) layer on the upper barrier layer along the sidewall of the upper wiring trench in a state in which the second selective suppression layer is formed, wherein the bottom surface of the upper wiring trench is free of the ruthenium layer; forming a cobalt (Co) layer on the ruthenium layer along the sidewall and the bottom surface of the upper wiring trench in the state in which the second selective suppression layer is formed; and forming a pre upper filling layer in the upper trench after removing the second selective suppression layer.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF EMBODIMENTS

Figure 1:
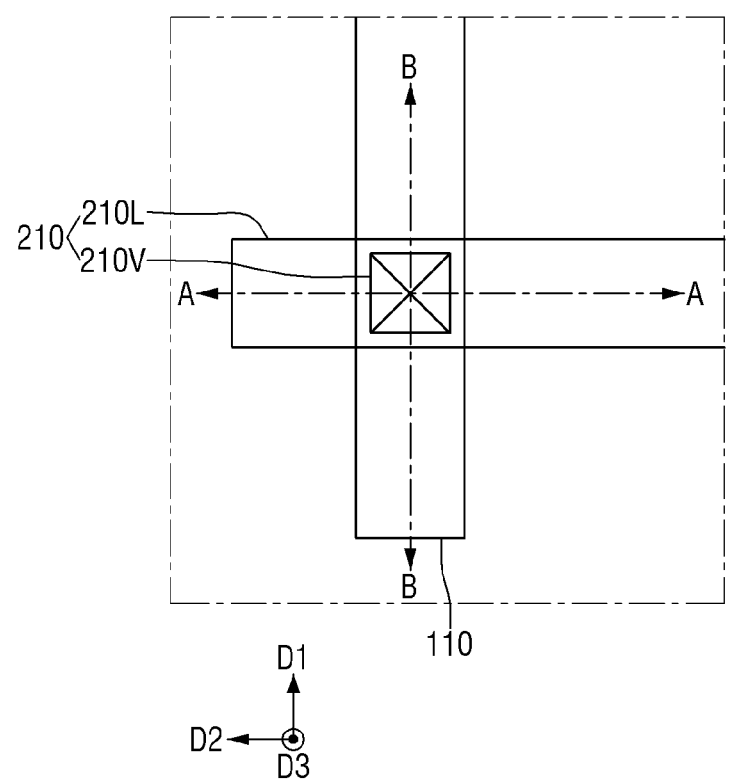
FIG. 1 is an example layout diagram illustrating a semiconductor device according to some example embodiments.

In the drawings of a semiconductor device according to some example embodiments, for example, a fin-type transistor (FinFET) including a fin-type pattern-shaped channel region, a transistor including a nanowire or a nanosheet, a multi-bridge channel field effect transistor (MBCFET™), or a vertical FET is illustrated, but the present disclosure is not limited thereto. The semiconductor device according to some example embodiments may include a tunneling FET or a three-dimensional (3D) transistor. The semiconductor device according to some example embodiments may include a planar transistor. In addition, a technical idea of the present disclosure may be applied to 2D material based FETs and a heterostructure thereof.

In addition, the semiconductor device according to some example embodiments may also include a bipolar junction transistor, a lateral double-diffused metal oxide semiconductor (LDMOS) transistor, or the like.

Figure 2:
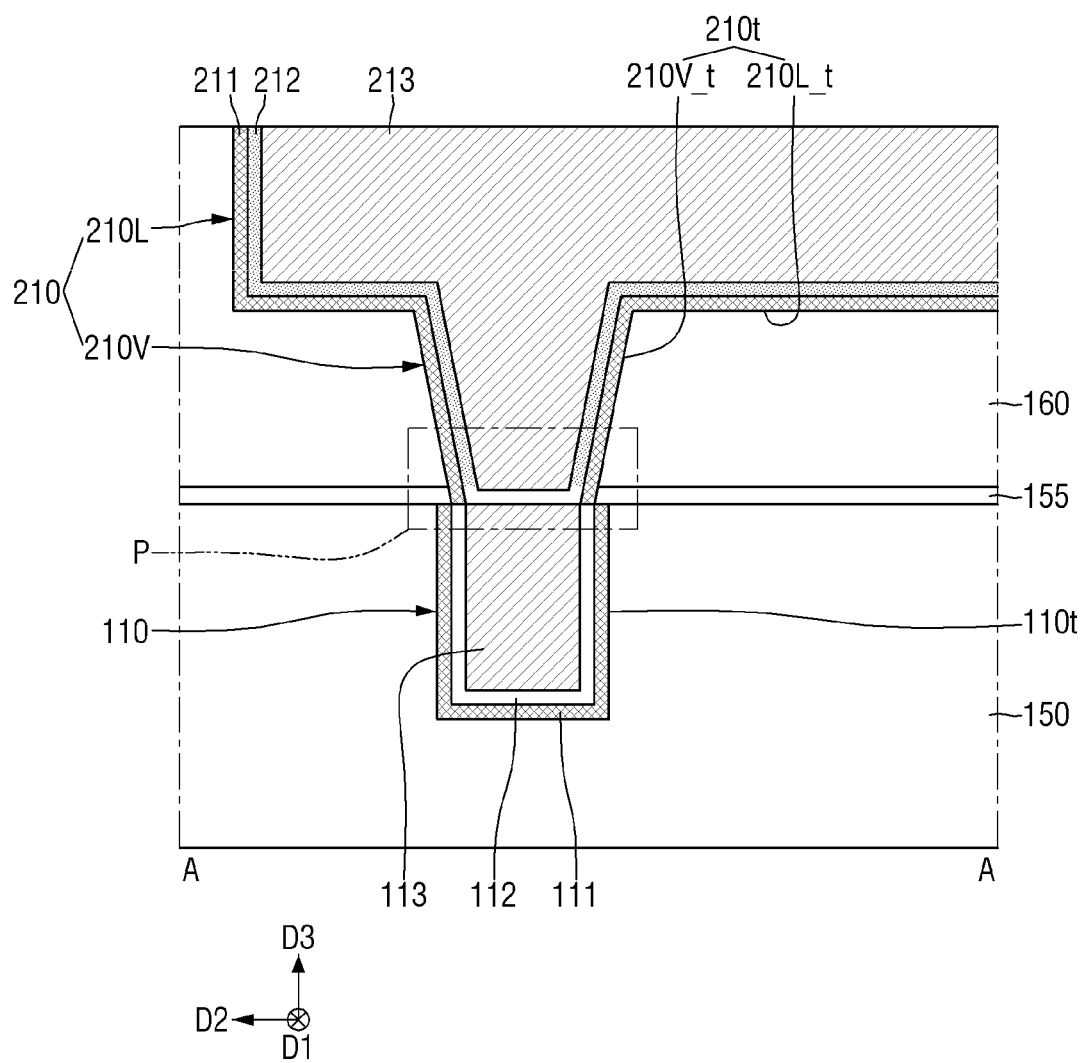
FIG. 2 is an example cross-sectional view taken along line A-A of FIG. 1.
Figure 3:
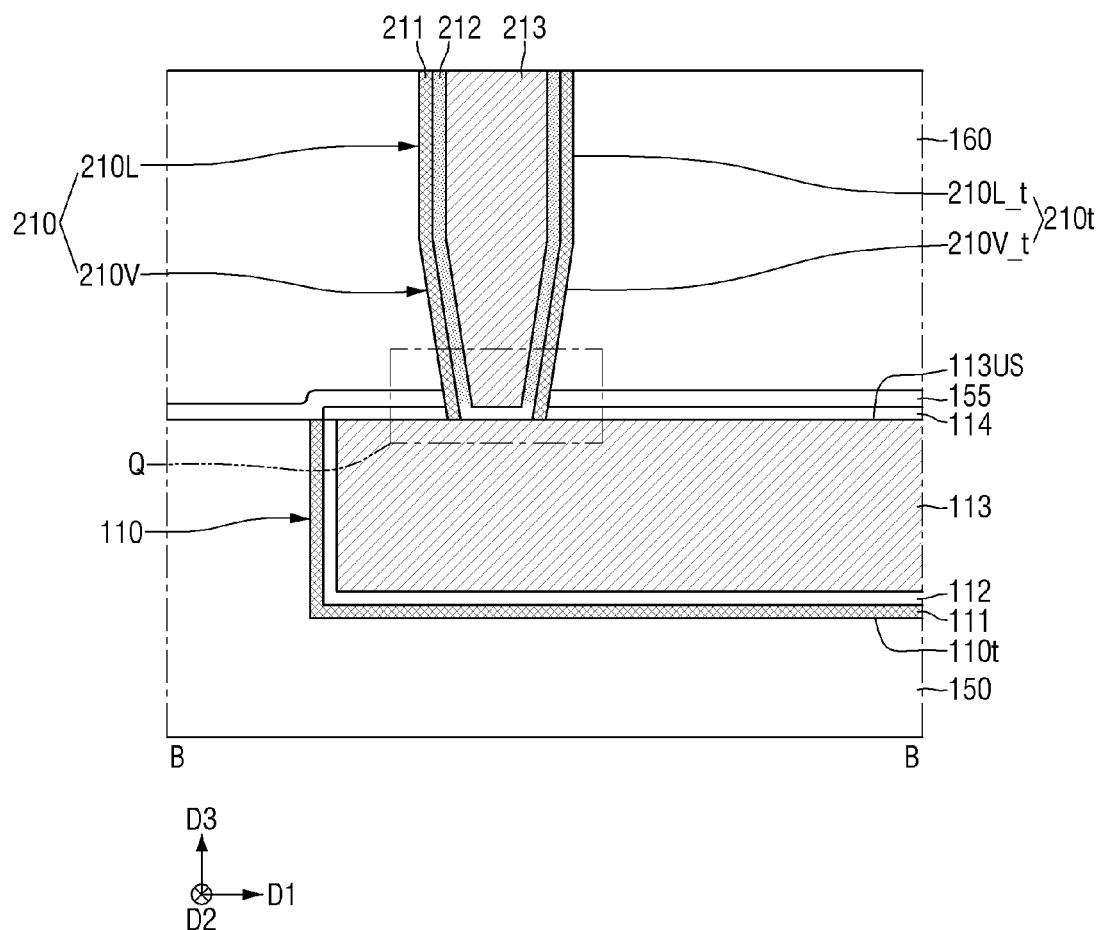
FIG. 3 is an example cross-sectional view taken along line B-B of FIG. 1.
Figure 4:
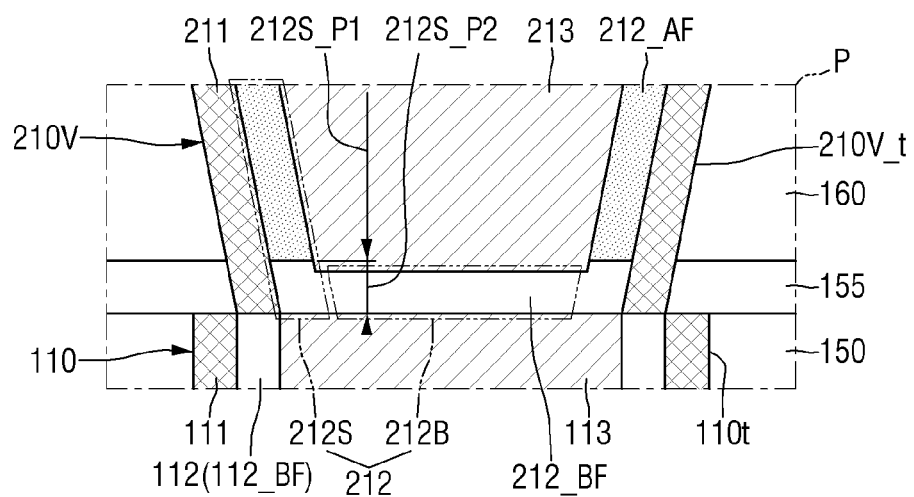
FIG. 4 is an enlarged view of part P of FIG. 2.
Figure 5:
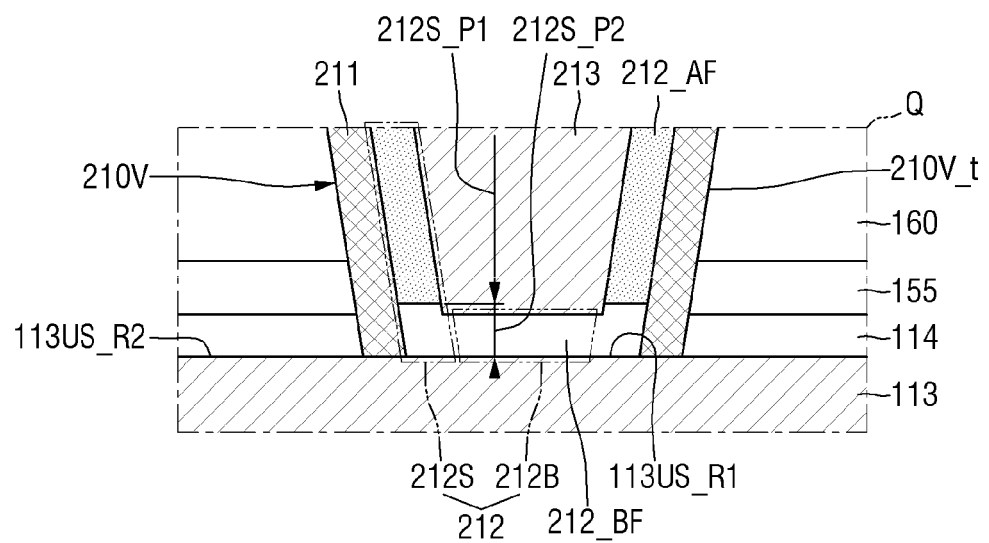
FIG. 5 is an enlarged view of part Q of FIG. 3.

FIG. 1 is an example layout diagram illustrating a semiconductor device according to some example embodiments. FIG. 2 is an example cross-sectional view taken along line A-A of FIG. 1. FIG. 3 is an example cross-sectional view taken along line B-B of FIG. 1. FIG. 4 is an enlarged view of part P of FIG. 2. FIG. 5 is an enlarged view of part Q of FIG. 3.

Referring to FIGS. 1 to 5, the semiconductor device according to some example embodiments may include a lower wiring structure 110 and an upper wiring structure 210.

The lower wiring structure 110 may be disposed in a first interlayer insulating layer 150. The lower wiring structure 110 may extend to be elongated in a first direction D1. The terms first, second, etc., may be used herein merely to distinguish one element or layer from another.

The lower wiring structure 110 may have a line shape extending in the first direction D1. For example, the first direction D1 may be a longitudinal direction of the lower wiring structure 110, and a second direction D2 may be a width direction of the lower wiring structure 110. Here, the first direction D1 intersects the second direction D2 and a third direction D3. The second direction D2 intersects the third direction D3.

The first interlayer insulating layer 150 may cover a gate electrode and a source/drain of a transistor formed in a front-end-of-line (FEOL) process. Alternatively, the first interlayer insulating layer 150 may be an interlayer insulating layer formed in the back-end-of-line (BEOL) process.

In other words, as an example, the lower wiring structure 110 may be a contact or a contact wiring formed in a middle-of-line (MOL) process. As another example, the lower wiring structure 110 may be a connection wiring formed in the back-end-of-line (BEOL) process. In the following description, the lower wiring structure 110 will be described as the connection wiring formed in the BEOL process.

The first interlayer insulating layer 150 may include, for example, at least one of silicon oxide, silicon nitride, silicon oxynitride, or a low-k material. The low-k material may be, for example, silicon oxide with moderately high carbon and hydrogen, and may be a material such as SiCOH. Meanwhile, since carbon is included in the insulating material, a dielectric constant of the insulating material may be lowered. However, in order to further lower the dielectric constant of the insulating material, the insulating material may include pores such as gas-filled or air-filled cavities within the insulating material.

The low-k material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, mesoporous silica, or a combination thereof, but is not limited thereto.

The lower wiring structure 110 may be disposed at a first metal level. The first interlayer insulating layer 150 may include a lower wiring trench 110t extending to be elongated in the first direction D1.

The lower wiring structure 110 may be disposed in the lower wiring trench 110t. The lower wiring trench 110t is filled with the lower wiring structure 110.

The lower wiring structure 110 may include a lower barrier layer 111, a lower liner 112, a lower filling layer 113, and a lower capping layer 114. The lower liner 112 may be disposed between the lower barrier layer 111 and the lower filling layer 113. The lower capping layer 114 may be disposed on the lower filling layer 113.

The lower barrier layer 111 may extend along sidewalls and a bottom surface of the lower wiring trench 110t. The lower liner 112 may be disposed on the lower barrier layer 111. The lower liner 112 may extend along the sidewalls and the bottom surface of the lower wiring trench 110t on the lower barrier layer 111.

The lower filling layer 113 is disposed on the lower liner 112. The remainder of the lower wiring trench 110t may be filled with the lower filling layer 113.

The lower capping layer 114 may extend along an upper surface 113US of the lower filling layer. In some embodiments, the lower capping layer 114 may be disposed on an upper surface of the lower liner 112. In some embodiments, unlike those illustrated in the drawings, the lower capping layer 114 may not cover the upper surface of the lower liner 112.

When the lower liner 112 and the lower capping layer 114 are formed of the same material, the upper surface of the lower liner 112 may not be distinguished at a boundary between the lower liner 112 and the lower capping layer 114.

In some embodiments, the lower capping layer 114 may not cover an upper surface of the lower barrier layer 111. In some embodiments, unlike those illustrated in the drawings, the lower capping layer 114 may cover at least a portion of the upper surface of the lower barrier layer 111.

The upper surface of the lower liner 112 is illustrated as being coplanar with the upper surface 113US of the lower filling layer and the upper surface of the lower barrier layer 111, but is not limited thereto. Here, the upper surface of the lower liner 112 may refer to the uppermost surface of a portion of the lower liner 112 extending along the sidewall of the lower wiring trench 110t.

The lower barrier layer 111 may include a conductive material, for example, metal nitride. The lower barrier layer 111 may include, for example, at least one of tantalum nitride (TaN), titanium nitride (TiN), tungsten nitride (WN), zirconium nitride (ZrN), vanadium nitride (VN), or niobium nitride (NbN). In the following description, the lower barrier layer 111 will be described as including tantalum nitride (TaN).

The lower liner 112 may include a conductive material, for example, a metal or a metal alloy. The lower liner 112 may include, for example, at least one of ruthenium (Ru), cobalt (Co), or a ruthenium-cobalt (RuCo) alloy.

In the semiconductor device according to some example embodiments, the lower liner 112 may be formed of cobalt (Co). The lower liner 112 may be formed of cobalt, and may be a lower cobalt layer 112_BF. Here, the "cobalt layer" may be a layer formed purely of cobalt, and may include impurities introduced in a process of forming the cobalt layer. That is, when an element or layer of a device is "formed of" a material, the element or layer may substantially or entirely include the material. For example, the lower liner 112 may be formed of Co and may be free of Ru.

The lower filling layer 113 may include a conductive material, for example, at least one of aluminum (Al), copper (Cu), tungsten (W), cobalt (Co), ruthenium (Ru), silver (Ag), gold (Au), manganese (Mn), molybdenum (Mo), rhodium (Rh), iridium (Ir), RuAl, NiAl, $NbB_2$, $MoB_2$, $TaB_2$, $V_2AlC$, or CrAlC. In the semiconductor device according to some example embodiments, the lower filling layer 113 may include copper (Cu).

The lower capping layer 114 may include a conductive material, for example, a metal. The lower capping layer 114 may include, for example, at least one of cobalt (Co), ruthenium (Ru), or manganese (Mn). In the semiconductor device according to some example embodiments, the lower capping layer 114 may include cobalt. The lower capping layer 114 may be formed of cobalt (Co).

In some embodiments, unlike those illustrated in the drawings, the lower wiring structure 110 may have a single-layer structure. Although not illustrated, a via pattern connecting the conductive patterns disposed under the lower wiring structure 110 may be further included.

The lower wiring structure 110 may be formed using, for example, a damascene method. In FIG. 2, a width of the lower wiring structure 110 in the second direction D2 is illustrated as being constant, but is not limited thereto. In some embodiments, unlike that illustrated in FIG. 2, as a distance from the upper surface of the first interlayer insulating layer 150 increases, the width of the lower wiring structure 110 in the second direction D2 may decrease.

A first etch stop layer 155 may be disposed on the lower wiring structure 110 and the first interlayer insulating layer 150. A second interlayer insulating layer 160 may be disposed on the first etch stop layer 155. The first etch stop layer 155 may be disposed between the first interlayer insulating layer 150 and the second interlayer insulating layer 160.

The second interlayer insulating layer 160 may include an upper wiring trench 210t. The upper wiring trench 210t may pass through the first etch stop layer 155. The upper wiring trench 210t exposes a portion of the lower wiring structure 110. The upper wiring trench 210t vertically overlaps a portion of the lower wiring structure 110 (e.g., in direction D3).

The upper wiring trench 210t may include an upper via trench 210V_t and an upper wiring line trench 210L_t. The upper wiring line trench 210L_t may extend to be elongated in the second direction D2. The upper wiring line trench 210L_t may extend into the upper surface of the second interlayer insulating layer 160. The upper via trench 210V_t may be formed on a bottom surface of the upper wiring line trench 210L_t.

For example, a bottom surface of the upper wiring trench 210t may be a bottom surface of the upper via trench 210V_t. The bottom surface of the upper wiring trench 210t may be defined by the lower wiring structure 110.

Sidewalls of the upper wiring trench 210t may include sidewalls and a bottom surface of the upper wiring line trench 210L_t and sidewalls of the upper via trench 210V_t. The sidewalls and the bottom surface of the upper wiring line trench 210L_t may be defined by the second interlayer insulating layer 160. The sidewalls of the upper via trench 210V_t may be defined by the second interlayer insulating layer 160 and the first etch stop layer 155.

In the semiconductor device according to some example embodiments, the upper wiring trench 210t may pass through the lower capping layer 114. The upper wiring trench 210t exposes a portion of the upper surface 113US of the lower filling layer. In this case, a portion of the sidewall of the upper via trench 210V_t may be defined by the lower capping layer 114. The bottom surface of the upper wiring trench 210t may be defined by the upper surface 113US of the lower filling layer.

The second interlayer insulating layer 160 may include, for example, at least one of silicon oxide, silicon nitride, silicon oxynitride, or a low-k material.

The first etch stop layer 155 may include a material having an etch selectivity with respect to the second interlayer insulating layer 160. The first etch stop layer 155 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlDC), or combinations thereof.

It has been illustrated that the first etch stop layer 155 is a single layer, but this is only for convenience of explanation and the present disclosure is not limited thereto. In some embodiments, unlike that illustrated in the drawing, the first etch stop layer 155 may include a plurality of insulating layers sequentially stacked on the first interlayer insulating layer 150.

The upper wiring structure 210 may be disposed in the upper wiring trench 210t. The upper wiring trench 210t may be filled with the upper wiring structure 210. The upper wiring structure 210 may be disposed in the second interlayer insulating layer 160.

The upper wiring structure 210 is disposed on the lower wiring structure 110. The upper wiring structure 210 is electrically connected to the lower wiring structure 110. The upper wiring structure 210 is in contact with the lower wiring structure 110. Elements or layers that are described as "in contact" or "in contact with" other elements or layers may refer to direct physical contact, with no intervening elements or layers therebetween.

The upper wiring structure 210 includes an upper wiring line 210L and an upper via 210V. The upper via 210V electrically connects the upper wiring line 210L and the lower wiring structure 110. The upper via 210V is in contact with the lower wiring structure 110.

In the semiconductor device according to some example embodiments, the upper surface 113US of the lower filling layer may include a first region 113US_R1 in contact with the upper wiring structure 210 and a second region 113US_R2 not in contact with the upper wiring structure 210. The upper via 210V is in contact with the first region 113US_R1 of the upper surface of the lower filling layer.

For example, the lower capping layer 114 is disposed on the second region 113US_R2 of the upper surface of the lower filling layer. The lower capping layer 114 covers the second region 113US_R2 of the upper surface of the lower filling layer. The lower capping layer 114 is not disposed on the first region 113US_R1 of the upper surface of the lower filling layer. The lower capping layer 114 does not cover the first region 113US_R1 of the upper surface of the lower filling layer.

When a portion of the lower capping layer 114 is etched to expose the first region 113US_R1 of the upper surface of the lower filling layer, the lower filling layer 113 is not removed by an etching process. The first region 113US_R1 of the upper surface of the lower filling layer is coplanar with the second region 113US_R2 of the upper surface of the lower filling layer.

The upper via trench 210V_t and the upper wiring line trench 210L_t are filled with the upper wiring structure 210. The upper wiring line 210L is disposed in the upper wiring line trench 210L_t. The upper via 210V is disposed in the upper via trench 210V_t.

The upper wiring line 210L is disposed at a second metal level different from the first metal level. The upper wiring line 210L is disposed at a second metal level higher than the first metal level.

The upper wiring structure 210 includes an upper barrier layer 211, an upper liner 212, and an upper filling layer 213. Although not illustrated, the upper wiring structure 210 may include an upper capping layer such as or similar to the lower capping layer 114.

The upper barrier layer 211 extends along the sidewalls of the upper wiring trench 210t. The upper barrier layer 211 does not extend along the bottom surface of the upper wiring trench 210t. The upper barrier layer 211 does not cover the entirety of the lower wiring structure 110 exposed by the upper via trench 210V_t.

The upper barrier layer 211 extends along the sidewalls and the bottom surface of the upper wiring line trench 210L_t and the sidewalls of the upper via trench 210V_t. The upper barrier layer 211 extends to the lower wiring structure 110 defining the bottom surface of the upper wiring trench 210t.

In the semiconductor device according to some example embodiments, the upper barrier layer 211 extends to the upper surface 113US of the lower filling layer. The upper barrier layer 211 is in contact with the upper surface 113US of the lower filling layer. In addition, the upper barrier layer 211 is in contact with the lower capping layer 114 defining the sidewall of the upper via trench 210V_t.

The upper barrier layer 211 may include a conductive material, for example, metal nitride. The upper barrier layer 211 may include, for example, at least one of tantalum nitride (TaN), titanium nitride (TiN), tungsten nitride (WN), zirconium nitride (ZrN), vanadium nitride (VN), or niobium nitride (NbN). In the following description, it will be described that the upper barrier layer 211 is formed of tantalum nitride (TaN).

The upper liner 212 is disposed on the upper barrier layer 211. The upper liner 212 is disposed between the upper barrier layer 211 and the upper filling layer 213. For example, the upper liner 212 may be in contact with the upper barrier layer 211.

The upper liner 212 extends along the sidewalls and the bottom surface of the upper wiring trench 210t. The upper liner 212 extends along the sidewalls and the bottom surface of the upper wiring line trench 210L_t and the sidewalls and the bottom surface of the upper via trench 210V_t.

The upper liner 212 is in contact with the lower wiring structure 110. The upper liner 212 is in contact with the upper surface 113US of the lower filling layer. The upper liner 212 extends along the upper surface 113US of the lower filling layer.

The upper liner 212 is not in contact with the lower capping layer 114. More specifically, the upper liner 212 is not in contact with the lower capping layer 114 defining the sidewall of the upper via trench 210V_t.

The upper liner 212 includes a sidewall portion 212S and a bottom portion 212B.

The sidewall portion 212S of the upper liner extends along the sidewall of the upper wiring trench 210t. The sidewall portion 212S of the upper liner extends along the sidewalls and the bottom surface of the upper wiring line trench 210L_t and the sidewalls of the upper via trench 210V_t.

The sidewall portion 212S of the upper liner extends to the lower wiring structure 110. The sidewall portion 212S of the upper liner is in contact with the upper surface 113US of the lower filling layer defining the bottom surface of the upper via trench 210V_t.

The bottom portion 212B of the upper liner extends along the bottom surface of the upper wiring trench 210t. The bottom portion 212B of the upper liner extends along the bottom surface of the upper via trench 210V_t.

The bottom portion 212B of the upper liner is in contact with the lower wiring structure 110. In the semiconductor device according to some example embodiments, the bottom portion 212B of the upper liner is in contact with the upper surface 113US of the lower filling layer defining the bottom surface of the upper wiring trench 210t.

The upper liner 212 includes ruthenium (Ru) and cobalt (Co). For example, the upper liner 212 may include an upper ruthenium-cobalt (RuCo) alloy layer 212_AF and an upper cobalt layer 212_BF. Here, the "ruthenium-cobalt alloy layer" may be a layer formed purely of ruthenium and cobalt (and may include impurities introduced in a process of forming the alloy layer).

In the semiconductor device according to some example embodiments, the upper ruthenium-cobalt alloy layer 212_AF extends along a portion of the sidewall of the upper wiring trench 210t.

The upper ruthenium-cobalt alloy layer 212_AF extends along the sidewalls and the bottom surface of the upper wiring line trench 210L_t. The upper ruthenium-cobalt alloy layer 212_AF extends along a portion of the sidewall of the upper via trench 210V_t. The upper ruthenium-cobalt alloy layer 212_AF does not extend to the upper surface 113US of the lower filling layer. The upper ruthenium-cobalt alloy layer 212_AF is not in contact with the lower filling layer 113.

For example, the upper ruthenium-cobalt alloy layer 212_AF is in contact with the upper barrier layer 211. The upper ruthenium-cobalt alloy layer 212_AF is in contact with the upper filling layer 213.

The upper cobalt layer 212_BF extends along the bottom surface of the upper wiring trench 210t. In the semiconductor device according to some example embodiments, the upper cobalt layer 212_BF is in contact with the upper barrier layer 211. The upper cobalt layer 212_BF is in contact with the lower filling layer 113.

The sidewall portion 212S of the upper liner includes ruthenium (Ru) and cobalt (Co). The bottom portion 212B of the upper liner is formed of cobalt (Co). For example, the composition of the sidewall portion 212S of the upper liner is different from the composition of the bottom portion 212B of the upper liner.

The bottom portion 212B of the upper liner is formed as a portion of the upper cobalt layer 212_BF. The sidewall portion 212S of the upper liner includes the remainder of the upper cobalt layer 212_BF and the upper ruthenium-cobalt alloy layer 212_AF.

A portion of the sidewall portion 212S of the upper liner is formed of ruthenium (Ru) and cobalt (Co). The sidewall portion 212S of the upper liner includes a first portion 212S_P1 formed of ruthenium (Ru) and cobalt (Co) and a second portion 212S_P2 formed of cobalt (Co). The first portion 212S_P1 of the sidewall portion of the upper liner is disposed on the second portion 212S_P2 of the sidewall portion of the upper liner. The second portion 212S_P2 of the sidewall portion of the upper liner is in contact with the lower wiring structure 110.

The first portion 212S_P1 of the sidewall portion of the upper liner includes the upper ruthenium-cobalt alloy layer 212_AF. For example, the first portion 212S_P1 of the sidewall portion of the upper liner is formed of the upper ruthenium-cobalt alloy layer 212_AF. The second portion 212S_P2 of the sidewall portion of the upper liner is formed of the upper cobalt layer 212_BF.

The upper filling layer 213 is disposed on the upper liner 212. The upper filling layer 213 may be in contact with the upper liner 212. The remainder of the upper wiring trench 210t may be filled with the upper filling layer 213.

Figure 6:
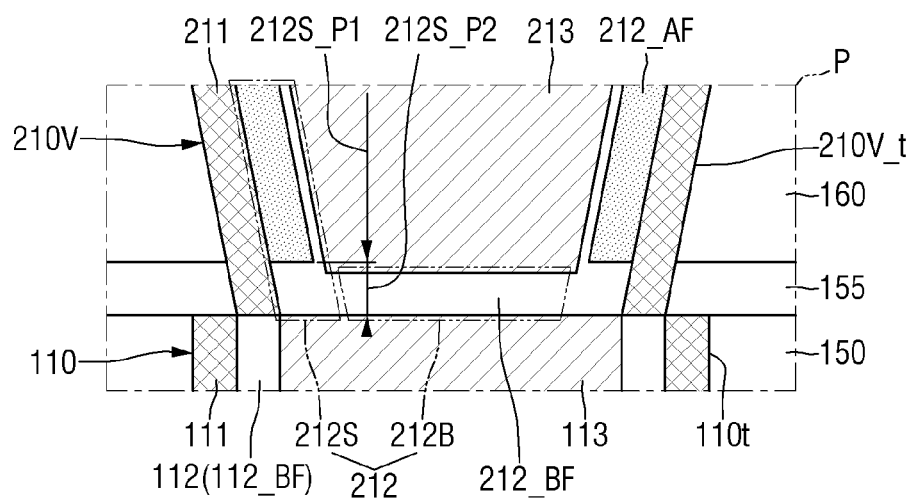
FIG. 6 is a view illustrating a semiconductor device according to some example embodiments.
Figure 7:
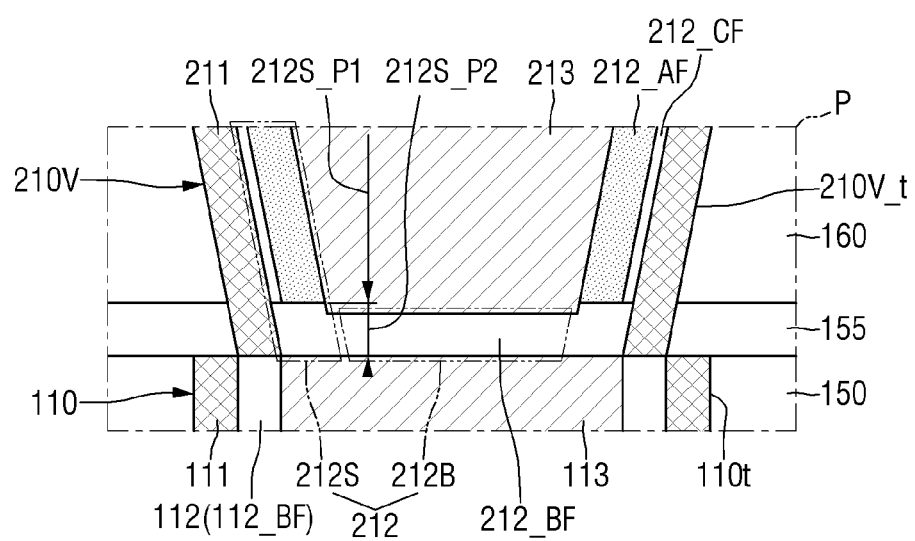
FIG. 7 is a view illustrating a semiconductor device according to some example embodiments.
Figure 8:
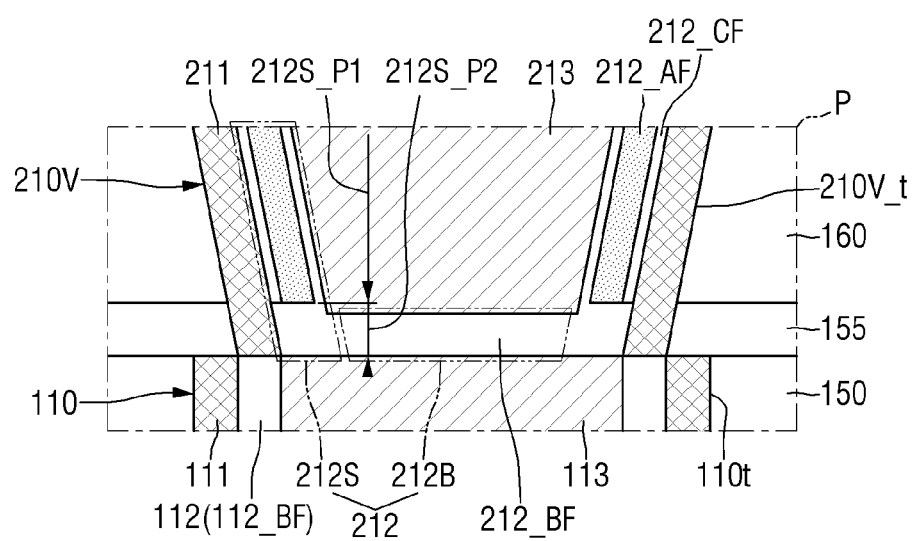
FIG. 8 is a view illustrating a semiconductor device according to some example embodiments.
Figure 9:
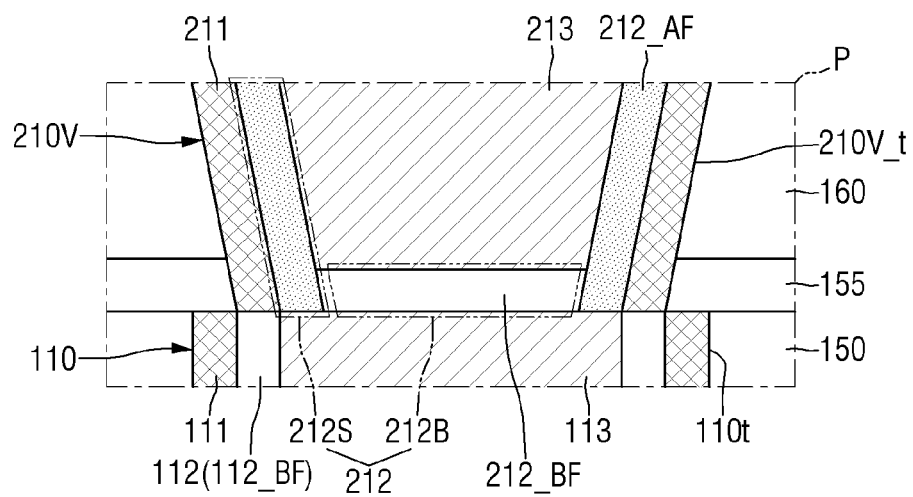
FIG. 9 is a view illustrating a semiconductor device according to some exemplary embodiments.

FIG. 6 is a view illustrating a semiconductor device according to some example embodiments. FIG. 7 is a view illustrating a semiconductor device according to some example embodiments. FIG. 8 is a view illustrating a semiconductor device according to some example embodiments. FIG. 9 is a view illustrating a semiconductor device according to some example embodiments. For convenience of explanation, points different from those described with reference to FIGS. 1 to 5 will be mainly described. For reference, FIGS. 6 to 9 are enlarged views of part P of FIG. 2.

Referring to FIG. 6, in the semiconductor device according to some example embodiments, the upper cobalt layer 212_BF may be disposed along a boundary between the upper ruthenium-cobalt alloy layer 212_AF and the upper filling layer 213.

A portion of the upper cobalt layer 212_BF may extend along the sidewalls of the upper via trench 210V_t and the sidewalls and the bottom surface of the upper wiring line trench 210L_t.

The upper ruthenium-cobalt alloy layer 212_AF may not be in contact with the upper filling layer 213. That is, the upper ruthenium-cobalt alloy layer 212_AF may be separated from the upper filling layer 213 by a portion of the upper cobalt layer 212_BF extending therebetween.

Referring to FIGS. 7 and 8, in the semiconductor device according to some example embodiments, the sidewall portion 212S of the upper liner may further include an upper ruthenium layer 212_CF extending along the sidewall of the upper wiring trench 210t.

The upper ruthenium layer 212_CF extends along the sidewalls and the bottom surface of the upper wiring line trench 210L_t. The upper ruthenium layer 212_CF may extend along a portion of the sidewall of the upper via trench 210V_t. The upper ruthenium layer 212_CF may be in contact with the upper barrier layer 211.

The upper ruthenium layer 212_CF may not extend to the upper surface 113US of the lower filling layer. The upper ruthenium layer 212_CF may not be in contact with the lower filling layer 113.

The upper ruthenium-cobalt alloy layer 212_AF is disposed between the upper ruthenium layer 212_CF and the upper filling layer 213. The upper ruthenium layer 212_CF is disposed between the upper ruthenium-cobalt alloy layer 212_AF and the upper barrier layer 211.

Here, the "ruthenium layer" may be a layer formed purely of ruthenium (and may include impurities introduced in a process of forming the ruthenium layer).

In FIG. 7, the upper ruthenium-cobalt alloy layer 212_AF may be in contact with the upper filling layer 213.

In FIG. 8, the upper ruthenium-cobalt alloy layer 212_AF may not be in contact with the upper filling layer 213. A portion of the upper cobalt layer 212_BF may be disposed along a boundary between the upper ruthenium-cobalt alloy layer 212_AF and the upper filling layer 213.

Referring to FIG. 9, in the semiconductor device according to some example embodiments, the entirety of the sidewall portion 212S of the upper liner is formed of ruthenium (Ru) and cobalt (Co).

The upper ruthenium-cobalt alloy layer 212_AF extends to the upper surface 113US of the lower filling layer. The upper ruthenium-cobalt alloy layer 212_AF is in contact with the lower filling layer 113. The upper cobalt layer 212_BF is not interposed between the upper ruthenium-cobalt alloy layer 212_AF and the lower filling layer 113.

The sidewall portion 212S of the upper liner formed of ruthenium (Ru) and cobalt (Co) is in contact with the lower wiring structure 110.

In FIGS. 7 and 8, when the upper ruthenium-cobalt alloy layer 212_AF extends to the upper surface 113US of the lower filling layer, the upper ruthenium layer 212_CF may extend to the upper surface 113US of the lower filling layer. That is, the upper ruthenium layer 212_CF may be in contact with the lower filling layer 113.

Figure 10:
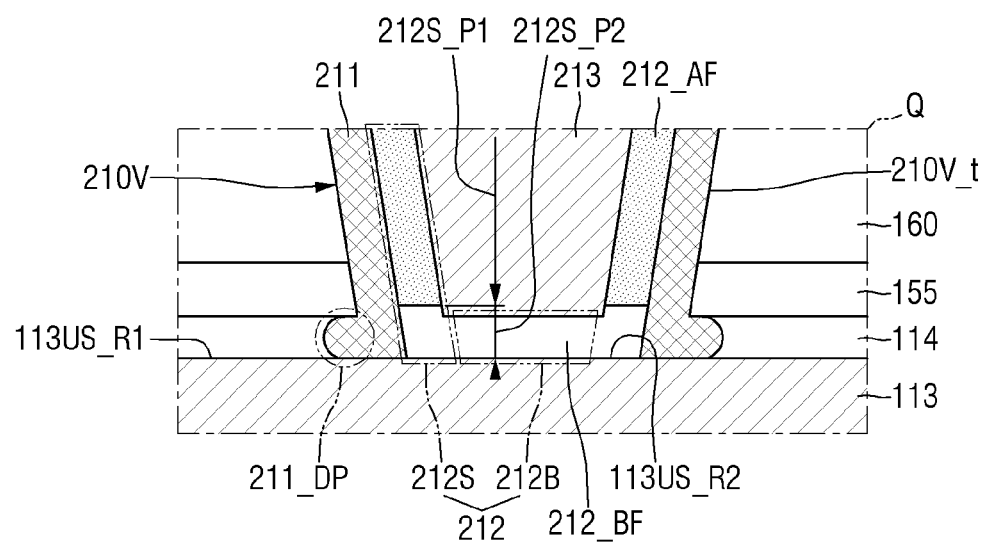
FIG. 10 is a view illustrating a semiconductor device according to some example embodiments.

FIG. 10 is a view illustrating a semiconductor device according to some example embodiments. For convenience of explanation, points different from those described with reference to FIGS. 1 to 5 will be mainly described. For reference, FIG. 10 is an enlarged view of part Q of FIG. 3.

Referring to FIG. 10, in the semiconductor device according to some example embodiments, the upper barrier layer 211 may include a dimple region 211_DP.

The dimple region 211_DP may be a portion protruding between the lower surface of the first etch stop layer 155 and the upper surface of the lower filling layer 113 facing each other.

In the fabricating process, a portion of the lower capping layer 114 may be removed using wet etching to expose the lower filling layer 113. During wet etching, the lower capping layer 114 may be under-cut. An undercut region of the lower capping layer 114 may be filled with the upper barrier layer 211.

Figure 11:
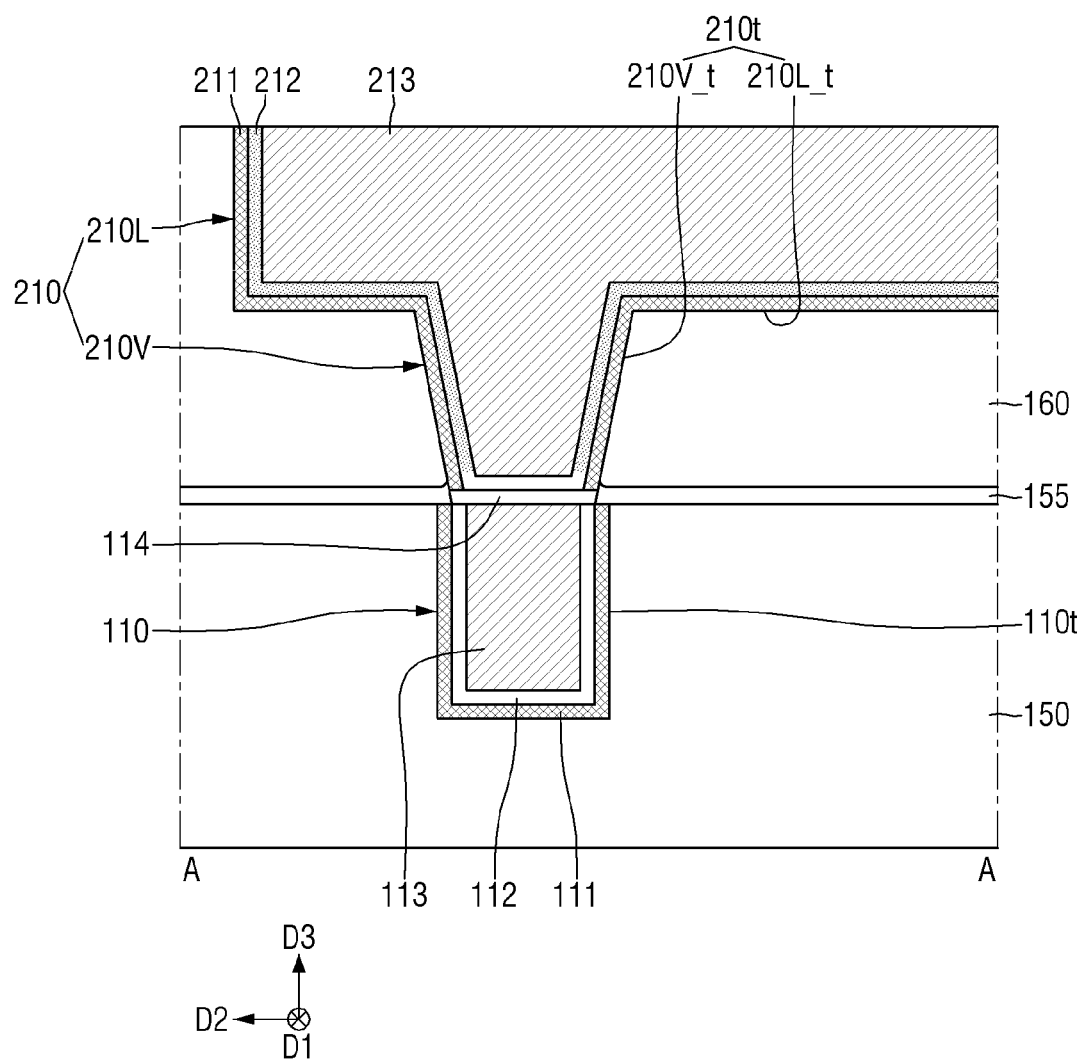
FIGS. 11 and 12 are views illustrating a semiconductor device according to some example embodiments.
Figure 12:
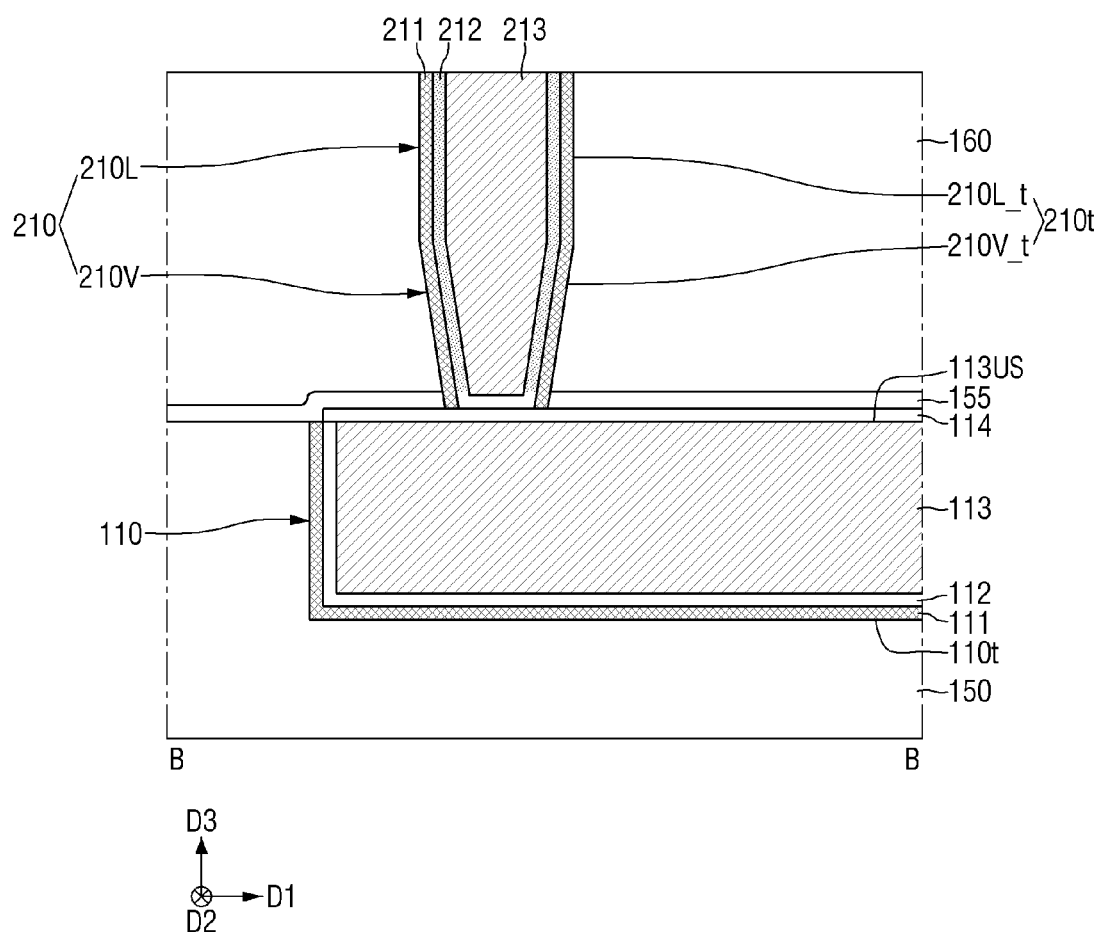

FIGS. 11 and 12 are views illustrating a semiconductor device according to some example embodiments. For convenience of explanation, points different from those described with reference to FIGS. 1 to 5 will be mainly described.

Referring to FIGS. 4, 11, and 12, in the semiconductor device according to some example embodiments, the upper liner 212 is in contact with the lower capping layer 114. The bottom portion 212B of the upper liner is in contact with the lower capping layer 114.

The upper wiring trench 210t does not pass through the lower capping layer 114. The upper wiring trench 210t does not expose the upper surface 113US of the lower filling layer.

The sidewall of the upper via trench 210V_t is not defined by the lower capping layer 114. The bottom surface of the upper wiring trench 210t may be defined by the lower capping layer 114.

The lower capping layer 114 may include a lower surface facing the lower filling layer 113 and an upper surface facing the first etch stop layer 155. The upper barrier layer 211 is in contact with the upper surface of the lower capping layer 114.

Figure 13:
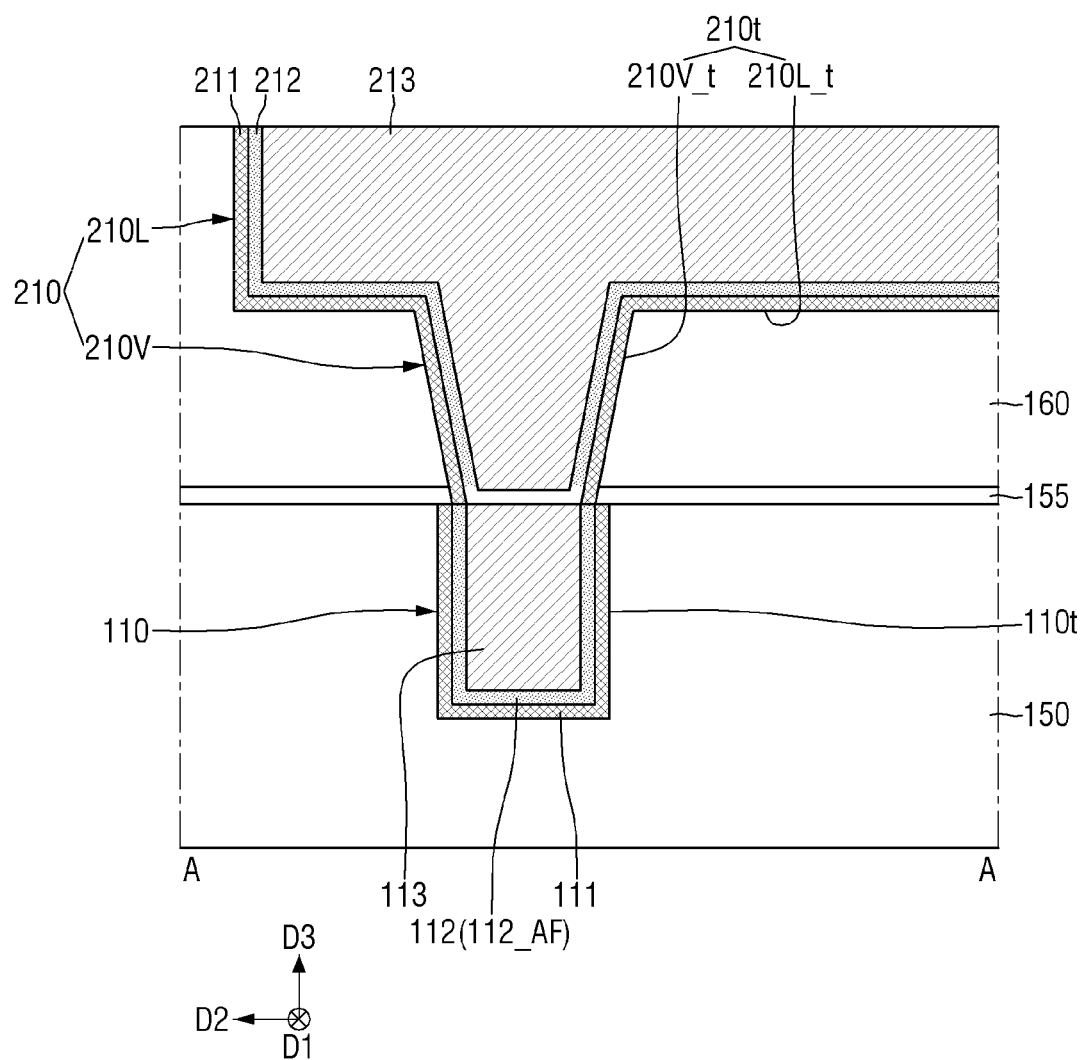
FIGS. 13 and 14 are views illustrating a semiconductor device according to some example embodiments.
Figure 14:
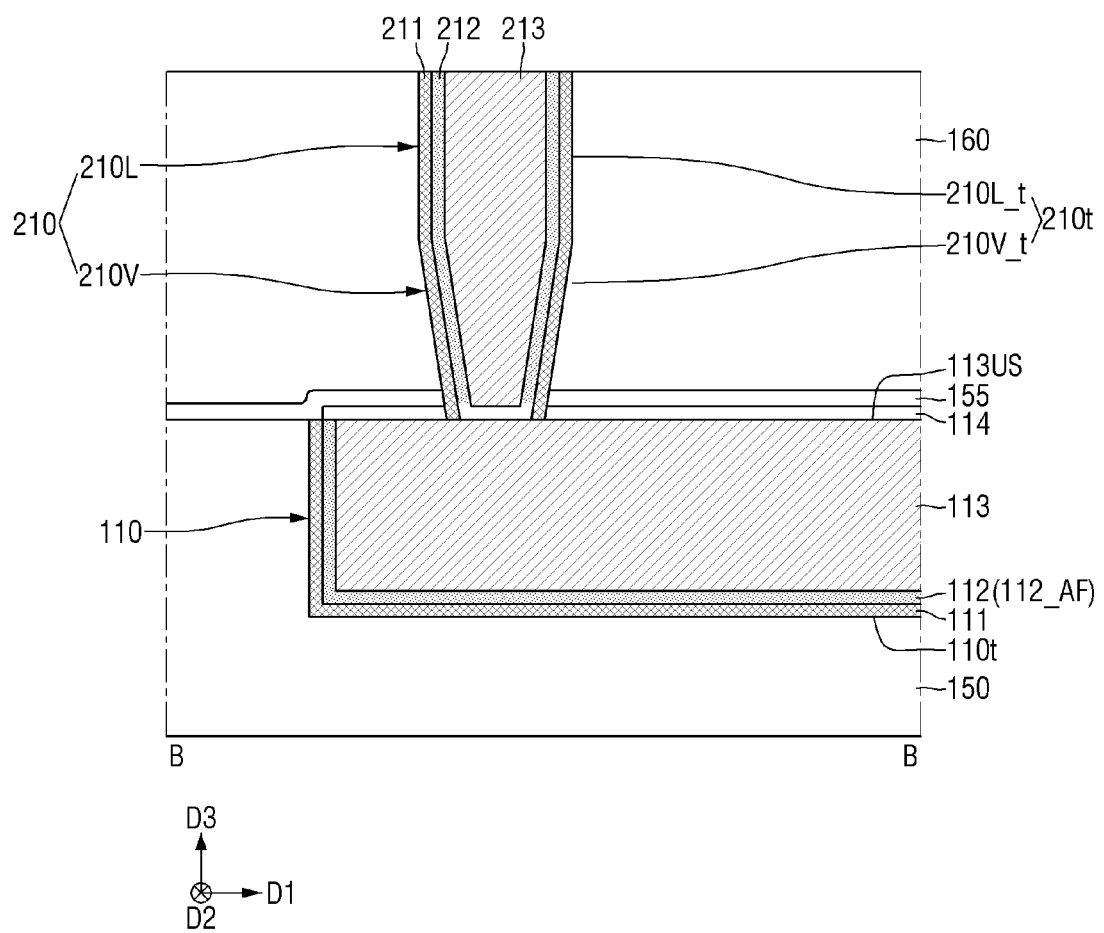

FIGS. 13 and 14 are views illustrating a semiconductor device according to some example embodiments. For convenience of explanation, points different from those described with reference to FIGS. 1 to 5 will be mainly described.

Referring to FIGS. 13 and 14, in the semiconductor device according to some example embodiments, the lower liner 112 may include cobalt (Co) and ruthenium (Ru).

The lower liner 112 may include the lower ruthenium-cobalt alloy layer 112_AF. As an example, the entirety of the lower liner 112 may be formed of the lower ruthenium-cobalt alloy layer 112_AF. As another example, the lower liner 112 may include a ruthenium layer as illustrated in FIGS. 7 and 8. As still another example, the lower liner 112 may include a cobalt layer disposed along a boundary between the lower ruthenium-cobalt alloy layer 112_AF and the lower filling layer 113.

Figure 15:
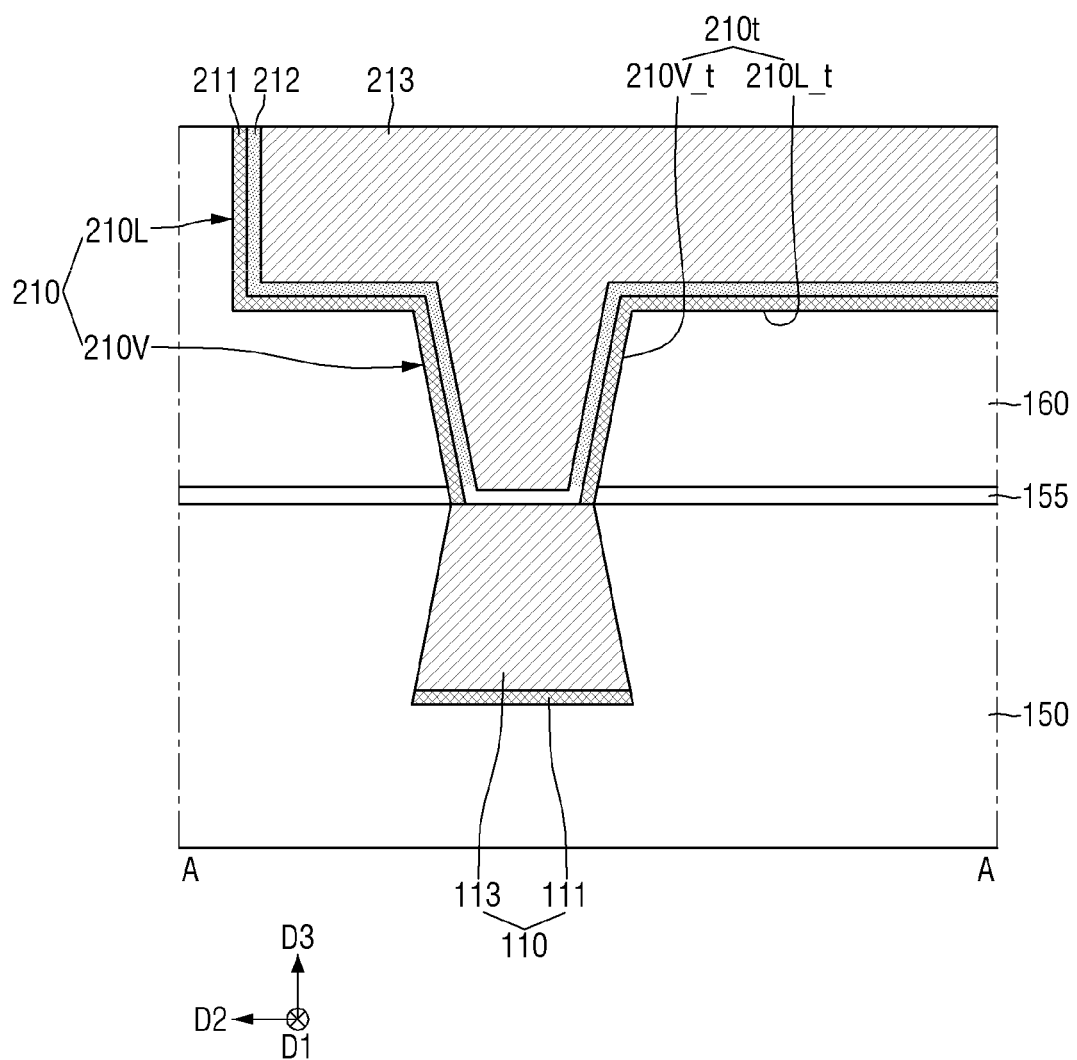
FIG. 15 is a view illustrating a semiconductor device according to some example embodiments.

FIG. 15 is a view illustrating a semiconductor device according to some example embodiments. For convenience of explanation, points different from those described with reference to FIGS. 1 to 5 will be mainly described.

Referring to FIG. 15, in the semiconductor device according to some example embodiments, as the lower wiring structure 110 moves away from the upper surface of the first interlayer insulating layer 150, the width of the lower wiring structure 110 in the second direction D2 may increase.

The lower wiring structure 110 may be formed using, for example, a subtractive process. In other words, after a conductive layer serving as a base material of the lower wiring structure 110 is formed, a mask pattern is formed on the conductive layer. By using the mask pattern as a mask, the conductive layer is etched. Through this, the lower wiring structure 110 may be formed.

The lower wiring structure 110 is illustrated as including the lower barrier layer 111 and the lower filling layer 113, but is not limited thereto. As an example, unlike that illustrated, a hard mask pattern may be disposed along the upper surface of the lower filling layer 113. As another example, unlike that illustrated, a passivation layer may be disposed along the sidewall of the lower filling layer 113. As still another example, the lower barrier layer 111 may be omitted. As still another example, the lower barrier layer 111 may include, for example, at least one of a metal nitride, a metal, a metal carbide, or a two-dimensional (2D) material. The two-dimensional material may be a metallic material and/or a semiconductor material. The 2D material may include a two-dimensional allotrope or a two-dimensional compound, and may include, for example, at least one of graphene, molybdenum disulfide ($MoS_2$), molybdenum diselenide ($MoSe_2$), tungsten diselenide ($WSe_2$), or tungsten disulfide ($WS_2$), but is not limited thereto. That is, since the above-described 2D material is only listed as an example, the 2D material that may be included in the semiconductor device of the present disclosure is not limited by the above-described material.

Figure 16:
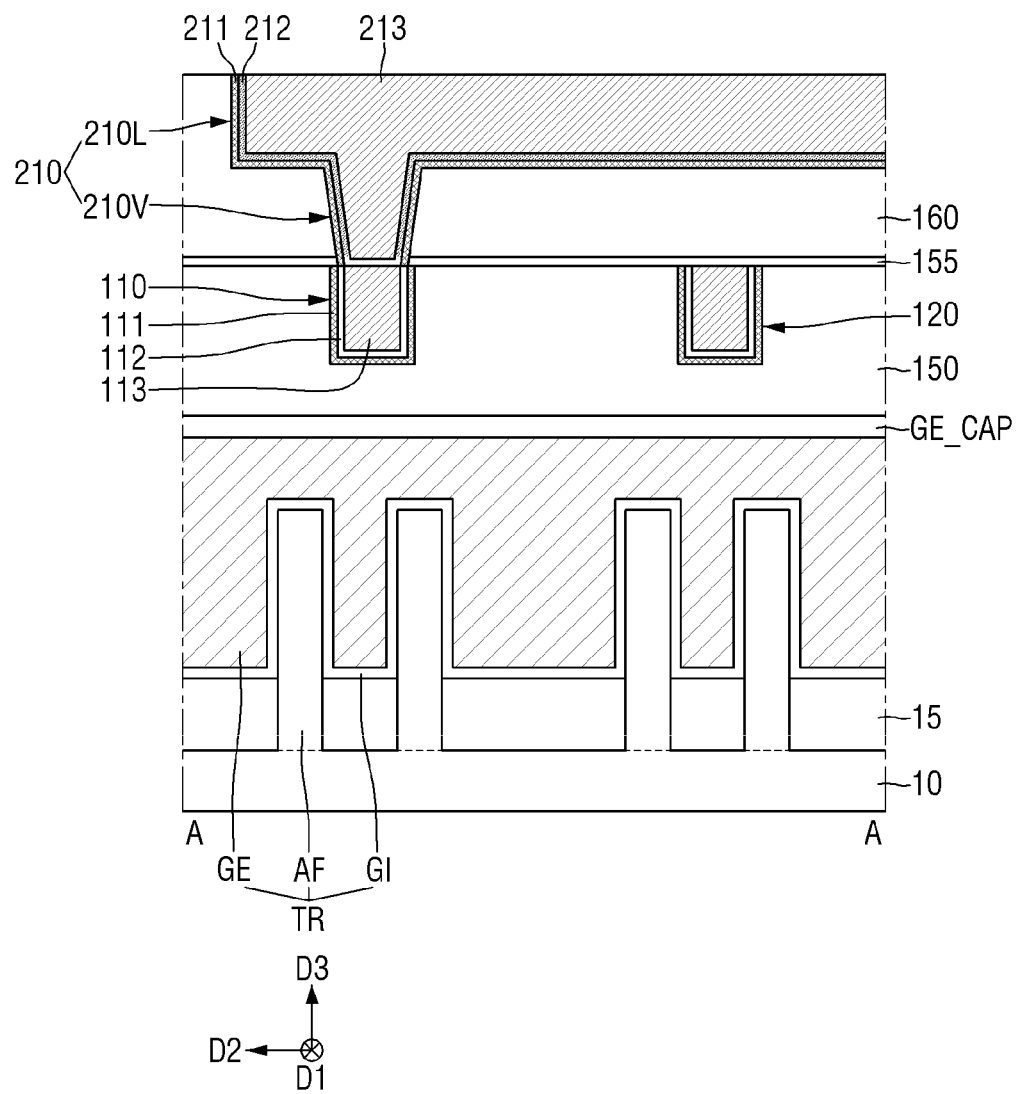
FIG. 16 is a view illustrating a semiconductor device according to some example embodiments.

FIG. 16 is a view illustrating a semiconductor device according to some example embodiments. For convenience of explanation, points different from those described with reference to FIGS. 1 to 5 will be mainly described.

For reference, FIG. 16 exemplarily illustrates a semiconductor device cut along a first gate electrode GE.

It is illustrated in FIG. 16 that the fin-shaped pattern AF extends in the first direction D1 and the first gate electrode GE extends in the second direction D2, but the present disclosure is not limited thereto.

Referring to FIG. 16, the semiconductor device according to some example embodiments may include a transistor TR disposed between a substrate 10 and the lower wiring structure 110.

The substrate 10 may be a silicon substrate or a silicon-on-insulator (SOI). Alternatively, the substrate 10 may include silicon germanium, silicon germanium on insulator (SGOI), indium antimonide, lead tellurium compound, indium arsenide, indium phosphide, gallium arsenide, or gallium antimonide, but is not limited thereto.

The transistor TR may include a fin-shaped pattern AF, a first gate electrode GE on the fin-shaped pattern AF, and a first gate insulating layer GI between the fin-shaped pattern AF and the first gate electrode GE.

Although not illustrated, the transistor TR may include source/drain patterns disposed on both sides of the first gate electrode GE.

The fin-shaped pattern AF may protrude from the substrate 10. The fin-shaped pattern AF may extend to be elongated in the first direction D1. The fin-shaped pattern AF may be a portion of the substrate 10, and may include an epitaxial layer grown from the substrate 10. The fin-shaped pattern AF may include silicon or germanium, which is an elemental semiconductor material. In addition, the fin-shaped pattern AF may include a compound semiconductor, for example, a group IV-IV compound semiconductor or a group III-V compound semiconductor.

The group IV-IV compound semiconductor may be, for example, a binary compound or a ternary compound including two or more of carbon (C), silicon (Si), germanium (Ge), and tin (Sn), or a compound obtained by doping carbon (C), silicon (Si), germanium (Ge), and tin (Sn) with a group IV element. The group III-V compound semiconductor may be, for example, one of a binary compound, a ternary compound, or a quaternary compound formed by combining at least one of aluminum (Al), gallium (Ga), or indium (In), which are group III elements, with one of phosphorus (P), arsenic (As), and antimony (Sb), which are group V elements.

A field insulating layer 15 may be formed on the substrate 10. The field insulating layer 15 may be formed on a portion of the sidewall of the fin-shaped pattern AF. The fin-shaped pattern AF may protrude above an upper surface of the field insulating layer 15. The field insulating layer 15 may include, for example, an oxide film, a nitride film, an oxynitride film, or a combination thereof.

The first gate electrode GE may be disposed on the fin-shaped pattern AF. The first gate electrode GE may extend in the second direction D2. The first gate electrode GE may cross or intersect with the fin-shaped pattern AF.

The first gate electrode GE may include, for example, at least one of a metal, a conductive metal nitride, a conductive metal carbonitride, a conductive metal carbide, a metal silicide, a doped semiconductor material, a conductive metal oxynitride, or a conductive metal oxide.

The first gate insulating layer GI may be disposed between the first gate electrode GE and the fin-shaped pattern AF and between the first gate electrode GE and the field insulating layer 15. The first gate insulating layer GI may include, for example, silicon oxide, silicon oxynitride, silicon nitride, or a high-k material having a dielectric constant greater than that of silicon oxide. The high-k material may include, for example, at least one of boron nitride, metal oxide, or metal silicon oxide.

The semiconductor device according to some example embodiments may include a negative capacitance (NC) FET using a negative capacitor. For example, the first gate insulating layer GI may include a ferroelectric material layer having ferroelectric characteristics and a paraelectric material layer having paraelectric characteristics.

The ferroelectric material layer may have a negative capacitance, and the paraelectric material layer may have a positive capacitance. For example, when two or more capacitors are connected to each other in series and the capacitance of each capacitor has a positive value, a total capacitance decreases as compared with a capacitance of each individual capacitor. On the other hand, when at least one of capacitances of two or more capacitors connected to each other in series has a negative value, a total capacitance may have a positive value and may be greater than an absolute value of each individual capacitance.

When the ferroelectric material layer having the negative capacitance and the paraelectric material layer having the positive capacitance are connected to each other in series, a total capacitance value of the ferroelectric material layer and the paraelectric material layer connected to each other in series may increase. A transistor including the ferroelectric material layer may have a subthreshold swing (SS) less than 60 mV/decade at room temperature, using the fact that the total capacitance value increases.

The ferroelectric material layer may have the ferroelectric characteristics. The ferroelectric material layer may include, for example, at least one of hafnium oxide, hafnium zirconium oxide, barium strontium titanium oxide, barium titanium oxide, or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of dopant included in the ferroelectric material layer may change depending on a type of ferroelectric material included in the ferroelectric material layer.

When the ferroelectric material layer includes the hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic % (at %) of aluminum. Here, a ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may contain 1 to 7 at % of gadolinium. When the dopant is zirconium (Zr), the ferroelectric material layer may include 50 to 80 at % of zirconium.

The paraelectric material layer may have the paraelectric characteristics. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but is not limited thereto.

The ferroelectric material layer and the paraelectric material layer may include the same material. The ferroelectric material layer may have the ferroelectric characteristics, but the paraelectric material layer may not have the ferroelectric characteristics. For example, when the ferroelectric material layer and the paraelectric material layer include hafnium oxide, a crystal structure of the hafnium oxide included in the ferroelectric material layer is different from a crystal structure of the hafnium oxide included in the paraelectric material layer.

The ferroelectric material layer may have a thickness having the ferroelectric characteristics. The thickness of the ferroelectric material layer may be, for example, 0.5 to 10 nm, but is not limited thereto. Since a critical thickness representing the ferroelectric characteristics may change for each ferroelectric material, the thickness of the ferroelectric material layer may change depending on the ferroelectric material.

As an example, the first gate insulating layer GI may include one ferroelectric material layer. As another example, the first gate insulating layer GI may include a plurality of ferroelectric material layers spaced apart from each other. The first gate insulating layer GI may have a stacked layer structure in which a plurality of ferroelectric material layers and a plurality of paraelectric material layers are alternately stacked.

A gate capping pattern GE CAP may be disposed on the first gate electrode GE. The conductive lower wirings 110 and 120 may be disposed on the first gate electrode GE. Although it is illustrated that the conductive lower wirings 110 and 120 are not connected to the first gate electrode GE, the present disclosure is not limited thereto. One of the conductive lower wirings 110 and 120 may be connected to the first gate electrode GE.

Figure 17:
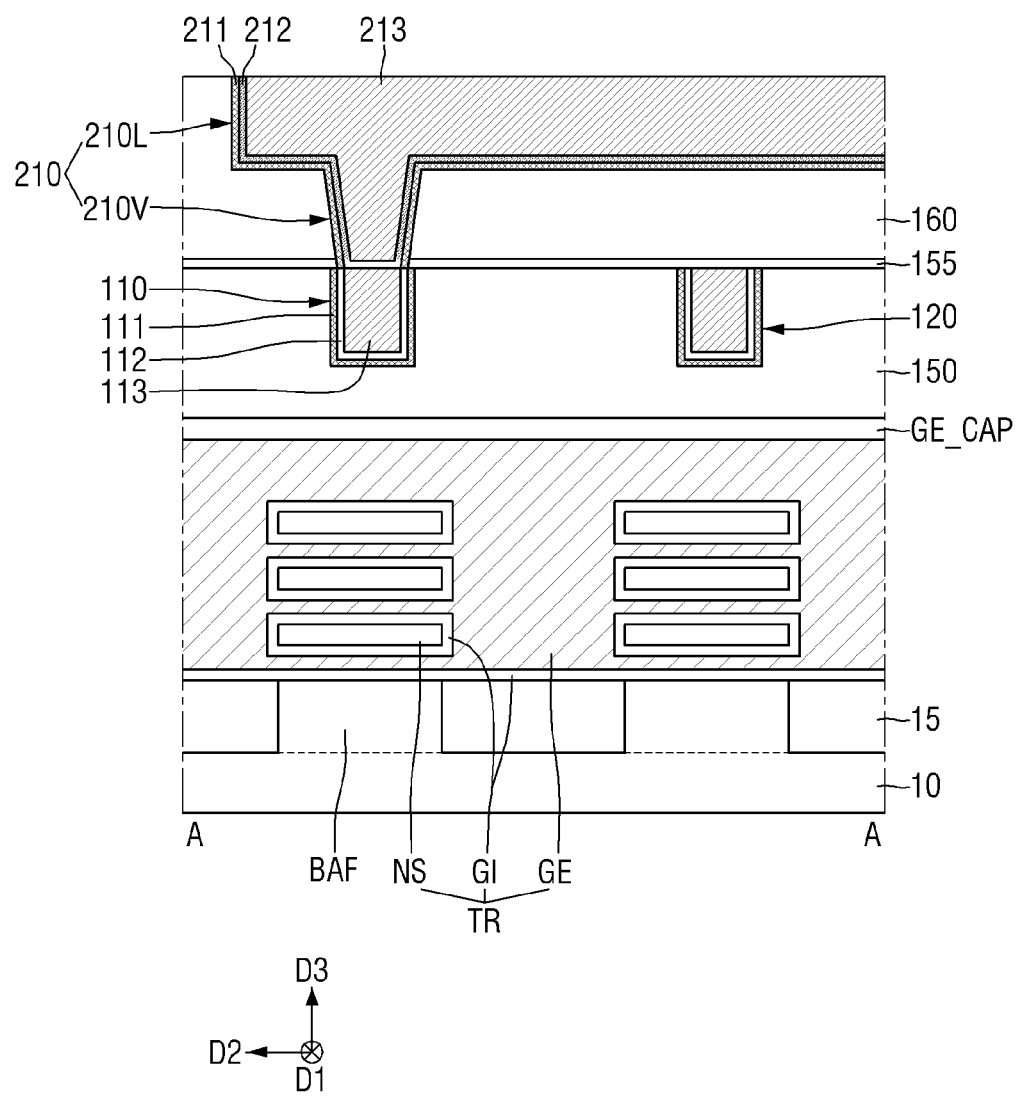
FIG. 17 is a view illustrating a semiconductor device according to some example embodiments.

FIG. 17 is a view illustrating a semiconductor device according to some example embodiments. For convenience of explanation, portions different from those described with reference to FIG. 16 will be mainly described.

Referring to FIG. 17, in the semiconductor device according to some example embodiments, the transistor TR may include a nanosheet NS, a first gate electrode GE surrounding the nanosheet NS, and a first gate insulating layer GI between the nanosheet NS and the first gate electrode GE.

The nanosheet NS may be disposed on a lower fin-shaped pattern BAF. The nanosheet NS may be spaced apart from the lower fin-shaped pattern BAF in the third direction D3. The transistor TR is illustrated as including three nanosheets NS spaced apart from each other in the third direction D3, but is not limited thereto. The number of nanosheets NS disposed in the third direction D3 on the lower fin-shaped pattern BAF may be greater than three or less than three.

Each of the lower fin-shaped pattern BAF and the nanosheet NS may include, for example, silicon or germanium, which is an elemental semiconductor material. Each of the lower fin-shaped pattern BAF and the nanosheet NS may include a compound semiconductor, for example, a group Iv-Iv compound semiconductor or a group III-v compound semiconductor. The lower fin-shaped pattern BAF and the nanosheet NS may include the same material or different materials.

Figure 18:
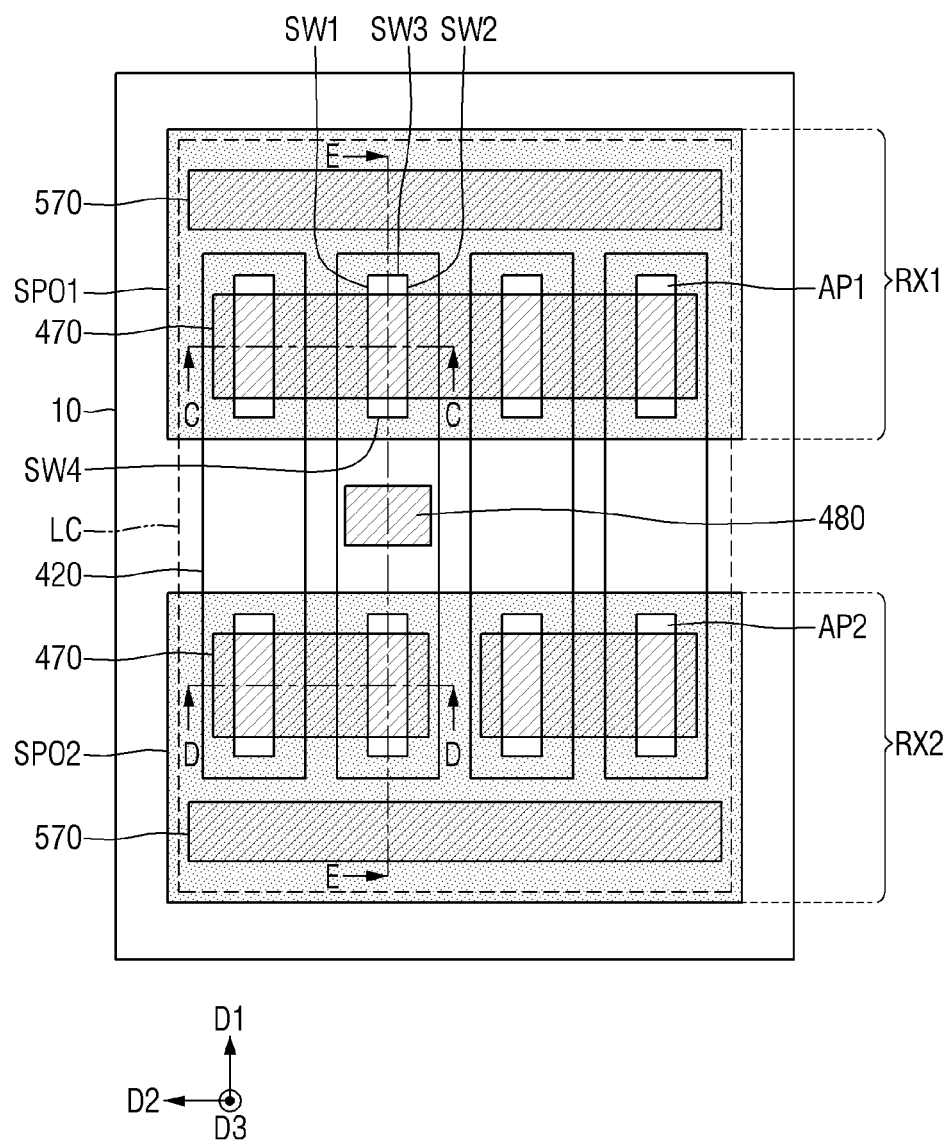
FIGS. 18, 19, and 20 are views illustrating a semiconductor device according to some example embodiments.
Figure 19:
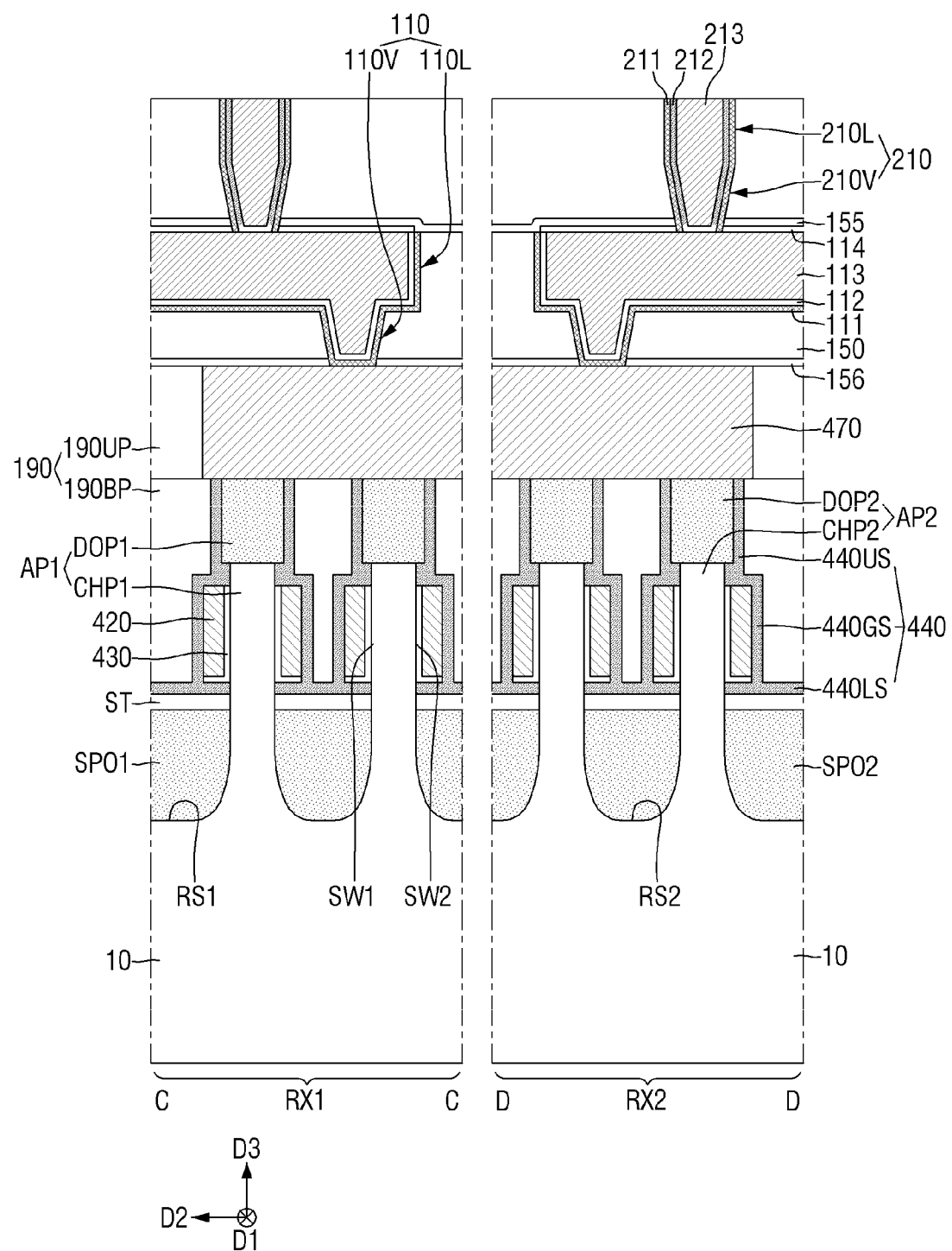
Figure 20:
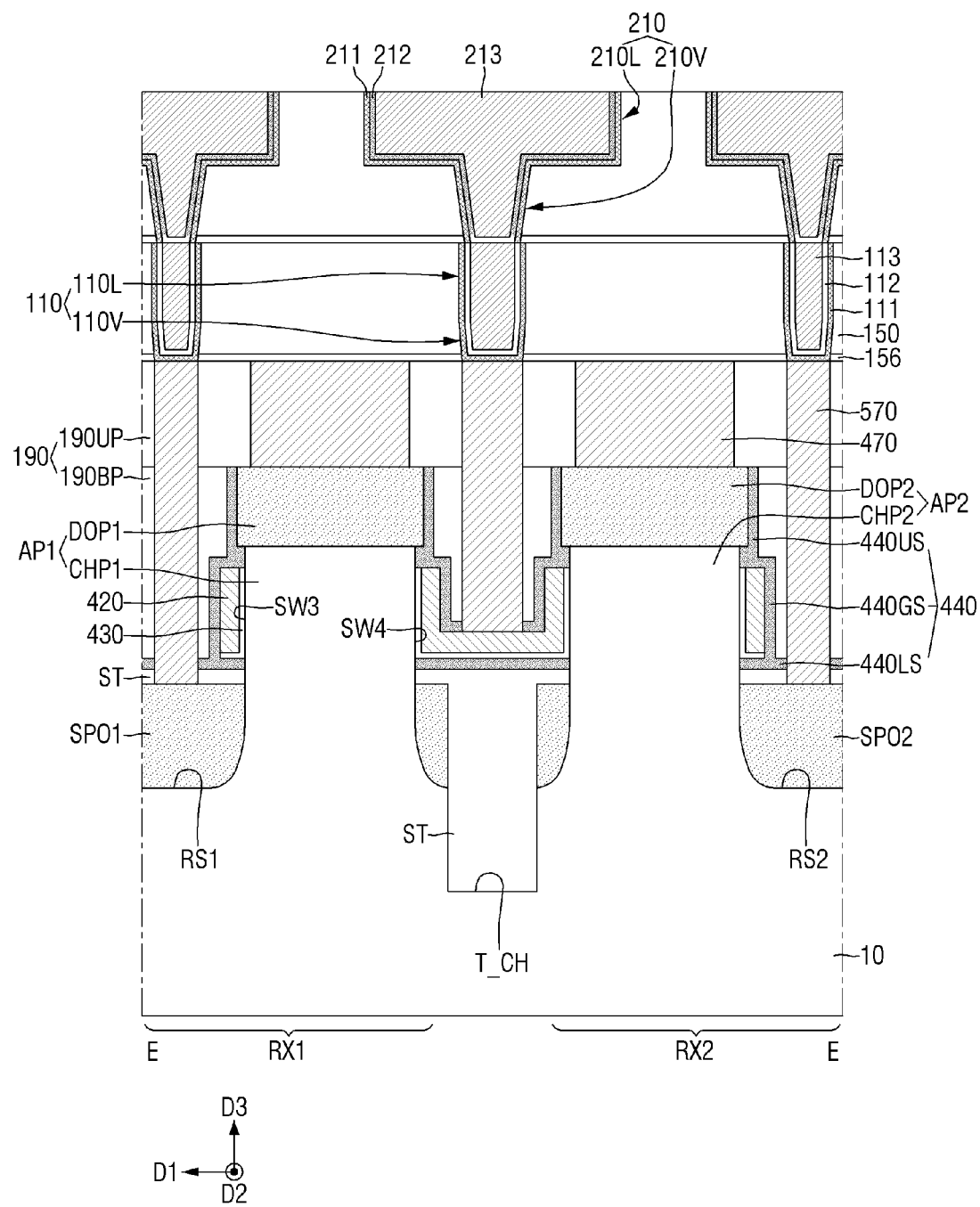

FIGS. 18 to 20 are views illustrating a semiconductor device according to some example embodiments. For reference, FIG. 18 is a view illustrating a semiconductor device according to some example embodiments. FIG. 19 is a cross-sectional view taken along lines C-C and D-D of FIG. 18. FIG. 20 is a cross-sectional view taken along line E-E of FIG. 18.

Referring to FIGS. 18 to 20, a logic cell LC may be provided on the substrate 10. The logic cell LC may refer to a logic device (e.g., an inverter, a flip-flop, etc.) that performs a specific function. The logic cell LC may include vertical FETs constituting a logic device and wirings connecting the vertical FETs to each other.

The logic cell LC on the substrate 10 may include a first active region RX1 and a second active region RX2. For example, the first active region RX1 may be a PMOSFET region, and the second active region RX2 may be an NMOSFET region. The first and second active regions RX1 and RX2 may be defined by a trench T_CH formed in an upper portion of the substrate 10. The first and second active regions RX1 and RX2 may be spaced apart from each other in the first direction D1.

A first lower epitaxial pattern SPO1 may be provided on the first active region RX1, and a second lower epitaxial pattern SPO2 may be provided on the second active region RX2. In plan view, the first lower epitaxial pattern SPO1 may overlap the first active region RX1, and the second lower epitaxial pattern SPO2 may overlap the second active region RX2. The first and second lower epitaxial patterns SPO1 and SPO2 may be epitaxial patterns formed by a selective epitaxial growth process. The first lower epitaxial pattern SPO1 may be provided in a first recess region RS1 of the substrate 10, and the second lower epitaxial pattern SPO2 may be provided in a second recess region RS2 of the substrate 10.

First active patterns AP1 may be provided on the first active region RX1, and second active patterns AP2 may be provided on the second active region RX2. Each of the first and second active patterns AP1 and AP2 may have a fin shape that vertically protrudes (e.g. in direction D3). In plan view, each of the first and second active patterns AP1 and AP2 may have a bar shape extending in the first direction D1. The first active patterns AP1 may be arranged along the second direction D2, and the second active patterns AP2 may be arranged along the second direction D2.

Each of the first active patterns AP1 may include a first channel pattern CHP1 vertically protruding from the first lower epitaxial pattern SPO1 and a first upper epitaxial pattern DOP1 on the first channel pattern CHP1. Each of the second active patterns AP2 may include a second channel pattern CHP2 vertically protruding from the second lower epitaxial pattern SPO2 and a second upper epitaxial pattern DOP2 on the second channel pattern CHP2.

A element separation layer ST may be provided on the substrate 10 to fill the trench T_CH. The element separation layer ST may cover upper surfaces of the first and second lower epitaxial patterns SPO1 and SPO2. The first and second active patterns AP1 and AP2 may vertically protrude above the element separation layer ST.

A plurality of second gate electrodes 420 extending parallel to each other in the first direction D1 may be provided on the element separation layer ST. The second gate electrodes 420 may be arranged along the second direction D2. The second gate electrode 420 may surround a first channel pattern CHP1 of the first active pattern AP1 and may surround a second channel pattern CHP2 of the second active pattern AP2. For example, the first channel pattern CHP1 of the first active pattern AP1 may have first to fourth sidewalls SW1 to SW4. The first and second sidewalls SW1 and SW2 may face or oppose each other in the second direction D2, and the third and fourth sidewalls SW3 and SW4 may face or oppose each other in the first direction D1. The second gate electrode 420 may be provided on the first to fourth sidewalls SW1 to SW4. In other words, the second gate electrode 420 may surround the first to fourth sidewalls SW1 to SW4.

A second gate insulating layer 430 may be interposed between the second gate electrode 420 and each of the first and second channel patterns CHP1 and CHP2. The second gate insulating layer 430 may cover a bottom surface of the second gate electrode 420 and an inner sidewall of the second gate electrode 420. For example, the second gate insulating layer 430 may directly cover the first to fourth sidewalls SW1 to SW4 of the first active pattern AP1.

The first and second upper epitaxial patterns DOP1 and DOP2 may vertically protrude above the second gate electrode 420. An upper surface of the second gate electrode 420 may be lower than a bottom surface of each of the first and second upper epitaxial patterns DOP1 and DOP2. In other words, each of the first and second active patterns AP1 and AP2 may have a structure that vertically protrudes from the substrate 10 and penetrates the second gate electrode 420.

The semiconductor device according to some example embodiments may include vertical transistors in which carriers move in the third direction D3. For example, when a voltage is applied to the second gate electrode 420 to "turn on" the transistor, the carriers may move from the lower epitaxial patterns SOP1 and SOP2 to the upper epitaxial patterns DOP1 and DOP2 through the channel patterns CHP1 and CHP2. In the semiconductor device according to some example embodiments, the second gate electrode 420 may completely surround the sidewalls SW1 to SW4 of the channel patterns CHP1 and CHP2. The transistor according to the present disclosure may be a three-dimensional field effect transistor (e.g., VFET) having a gate all around structure. Since the gate surrounds the channel, the semiconductor device according to some example embodiments may have excellent electrical characteristics.

A spacer 440 covering the second gate electrodes 420 and the first and second active patterns AP1 and AP2 may be provided on the element separation layer ST. The spacer 440 may include a silicon nitride layer or a silicon oxynitride layer. The spacer 440 may include a lower spacer 440LS, an upper spacer 440US, and a gate spacer 440GS between the lower and upper spacers 440LS and 440US.

The lower spacer 440LS may directly cover an upper surface of the element separation layer ST. The second gate electrodes 420 may be spaced apart from the element separation layer ST in the third direction D3 by the lower spacer 440LS. The gate spacer 440GS may cover an upper surface and an outer sidewall of each of the second gate electrodes 420. The upper spacer 440US may cover the first and second upper epitaxial patterns DOP1 and DOP2. However, the upper spacer 440US may not cover upper surfaces of the first and second upper epitaxial patterns DOP1 and DOP2, but may expose the upper surfaces of the first and second upper epitaxial patterns DOP1 and DOP2.

A first portion 190BP of the lower interlayer insulating layer may be provided on the spacer 440. An upper surface of the first portion 190BP of the lower interlayer insulating layer may be substantially coplanar with the upper surfaces of the first and second upper epitaxial patterns DOP1 and DOP2. A second portion 190UP of the lower interlayer insulating layer and the first and second interlayer insulating layers 150 and 160 may be sequentially stacked on the first portion 190BP of the lower interlayer insulating layer. The first portion 190BP of the lower interlayer insulating layer and the second portion 190UP of the lower interlayer insulating layer may be included in a lower interlayer insulating layer 190. The second portion 190UP of the lower interlayer insulating layer may cover the upper surfaces of the first and second upper epitaxial patterns DOP1 and DOP2.

At least one first source/drain contact 470 that penetrates through the second portion 190UP of the lower interlayer insulating layer and is connected to the first and second upper epitaxial patterns DOP1 and DOP2 may be provided. At least one second source/drain contact 570 that sequentially penetrates through the lower interlayer insulating layer 190, the lower spacer 440LS, and the element separation layer ST and is connected to the first and second lower epitaxial patterns SPO1 and SPO2 may be provided. A gate contact 480 that sequentially penetrates through the second portion 190UP of the lower interlayer insulating layer, the first portion 190BP of the lower interlayer insulating layer, and the gate spacer 440GS and is connected to the second gate electrode 420 may be provided.

A second etch stop layer 156 may be additionally disposed between the second portion 190UP of the lower interlayer insulating layer and the first interlayer insulating layer 150. The first etch stop layer 155 may be disposed between the first interlayer insulating layer 150 and the second interlayer insulating layer 160.

The lower wiring structure 110 may be provided in the first interlayer insulating layer 150. The lower wiring structure 110 may include a lower via 110V and a lower wiring line 110L. Descriptions of the lower via 110V and the lower wiring line 110L may be similar to those of the upper via 210V and the upper wiring line 210L. However, the layer structure of the lower wiring structure 110 may be different from or the same as the layer structure of the upper wiring structure 210.

The lower wiring structure 110 may be connected to the first source/drain contact 470, the second source/drain contact 570, and the gate contact 480. The upper wiring structure 210 may be provided in the second interlayer insulating layer 160.

In some embodiments, unlike that illustrated, for example, an additional wiring structure similar to the upper wiring structure 210 may be further disposed between the first source/drain contact 470 and the lower wiring structure 110.

A detailed description of the upper wiring structure 210 may be substantially the same as that described above with reference to FIGS. 1 to 15.

FIGS. 21 to 29 are intermediate step views illustrating a method of fabricating a semiconductor device according to some example embodiments.

For reference, FIGS. 21, 23 to 25, and 27 to 29 are cross-sectional views taken along line A-A of FIG. 1, respectively. FIGS. 22 and 26 are cross-sectional views taken along line B-B of FIG. 1.

Figure 21:
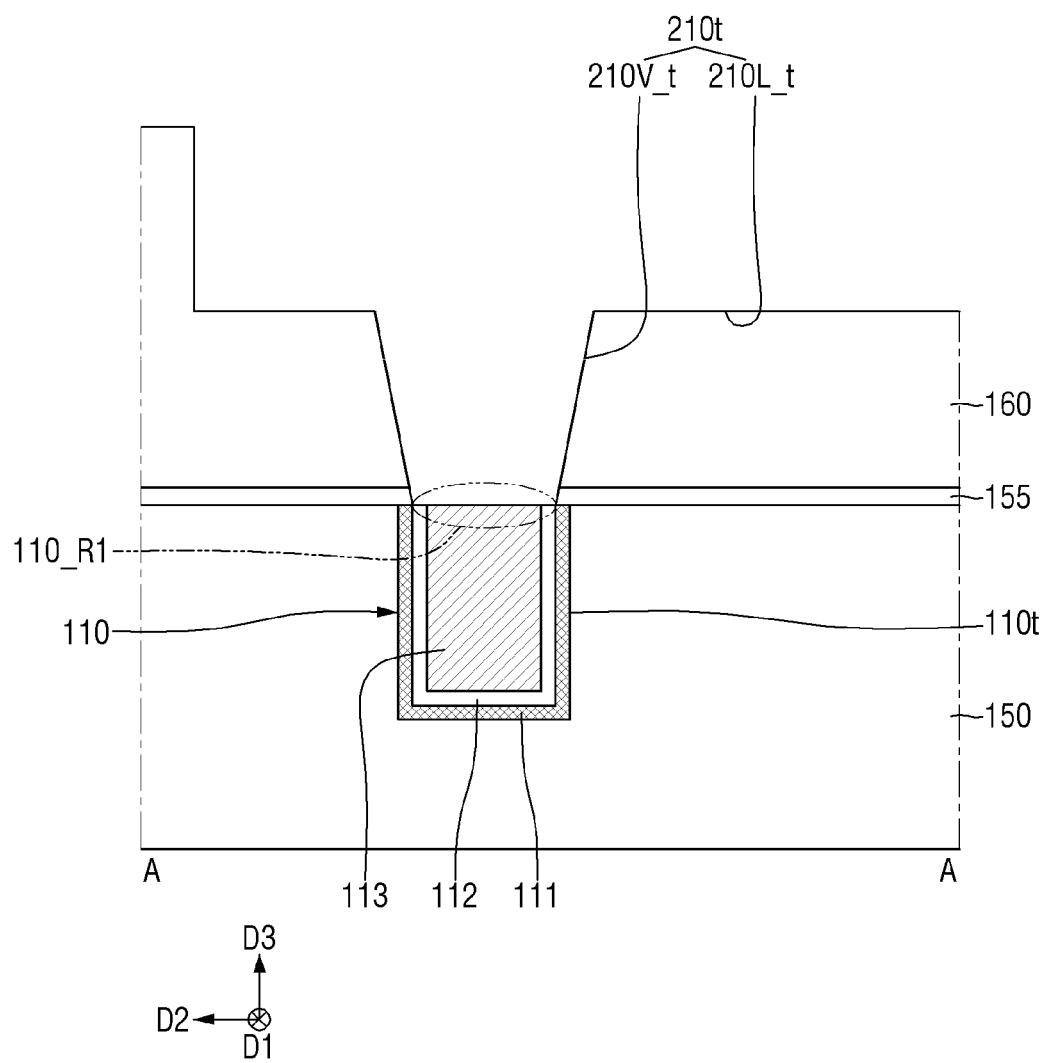
FIGS. 21, 22, 23, 24, 25, 26, 27 28, and 29 are intermediate step views illustrating a method of fabricating a semiconductor device according to some example embodiments.
Figure 22:
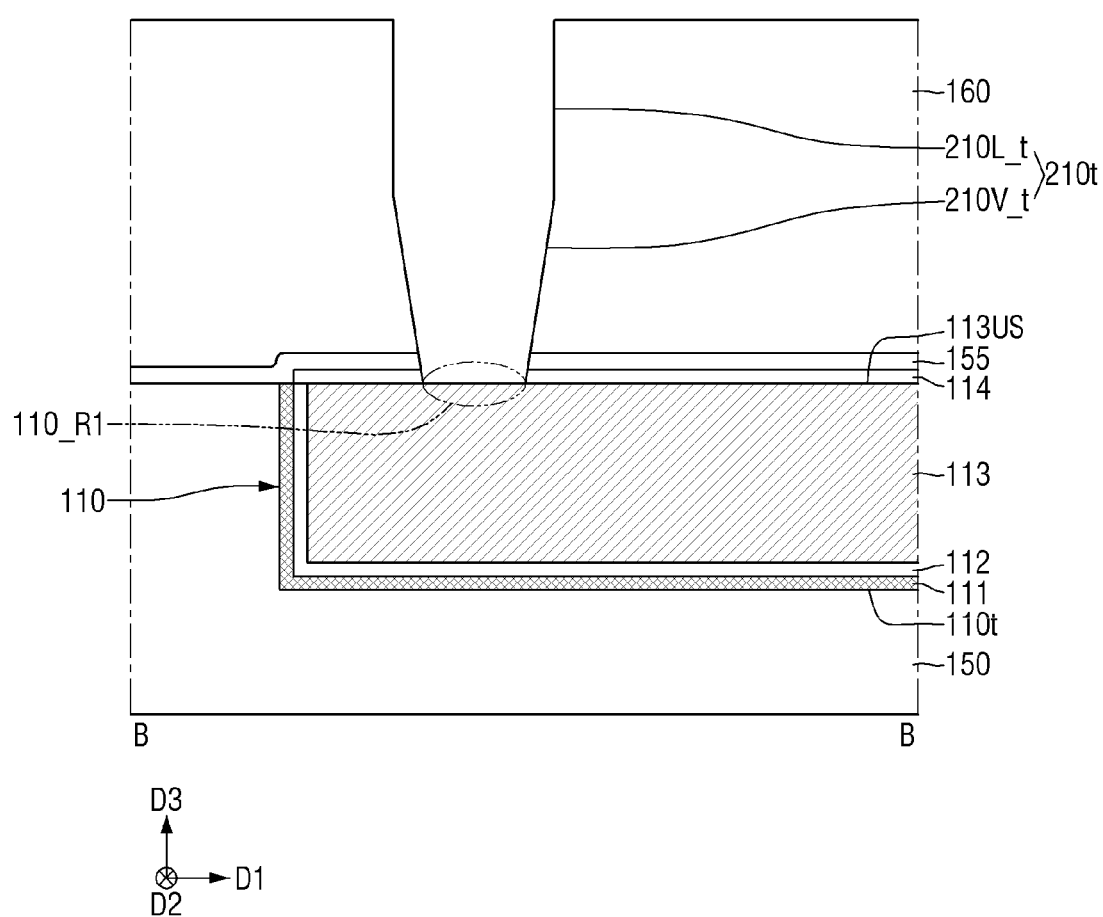

Referring to FIGS. 21 and 22, a lower wiring structure 110 is formed in a first interlayer insulating layer 150.

A lower wiring trench 110t is formed in the first interlayer insulating layer 150. The lower wiring structure 110 is formed in the lower wiring trench 110t. The lower wiring structure 110 may include a lower barrier layer 111, a lower liner 112, a lower filling layer 113, and a lower capping layer 114.

Subsequently, a first etch stop layer 155 may be formed on the first interlayer insulating layer 150 and the lower wiring structure 110.

A second interlayer insulating layer 160 may be disposed on the first etch stop layer 155. The second interlayer insulating layer 160 may include an upper wiring trench 210t. The upper wiring trench 210t includes an upper via trench 210V_t and an upper wiring line trench 210L_t.

The upper wiring trench 210t may penetrate through the first etch stop layer 155. The upper wiring trench 210t may pass through the lower capping layer 114. In some embodiments, unlike that illustrated, the upper wiring trench 210t may not pass through the lower capping layer 114.

The upper wiring trench 210t may expose a first region 110_R1 of the lower wiring structure. The upper wiring trench 210t may expose a portion of an upper surface of the lower filling layer 113.

Figure 23:
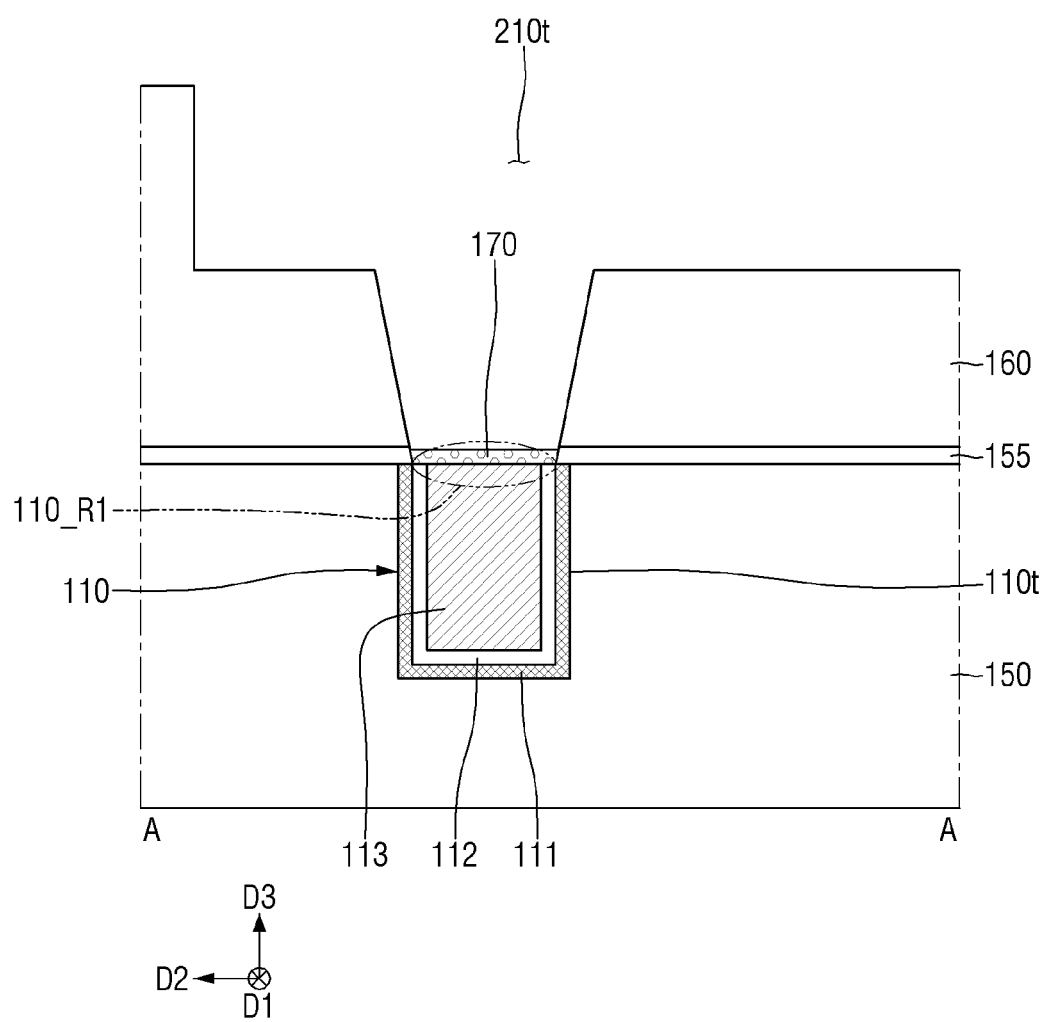

Referring to FIG. 23, a first selective suppression layer 170 is formed on the first region 110_R1 of the lower wiring structure exposed by the upper wiring trench 210t.

The first selective suppression layer 170 includes an organic material. The first selective suppression layer 170 may selectively prevent a conductive material from being deposited on a surface on which the first selective suppression layer 170 is formed. For example, a conductive material A is not deposited on the surface on which the first selective suppression layer 170 is formed. On the other hand, a conductive material B may be deposited on the surface on which the first selective suppression layer 170 is formed.

The first selective suppression layer 170 may be formed on a conductive material. For example, the first selective suppression layer 170 may be formed on a metal or a metal alloy. The first selective suppression layer 170 is not formed on an insulating material.

Figure 24:
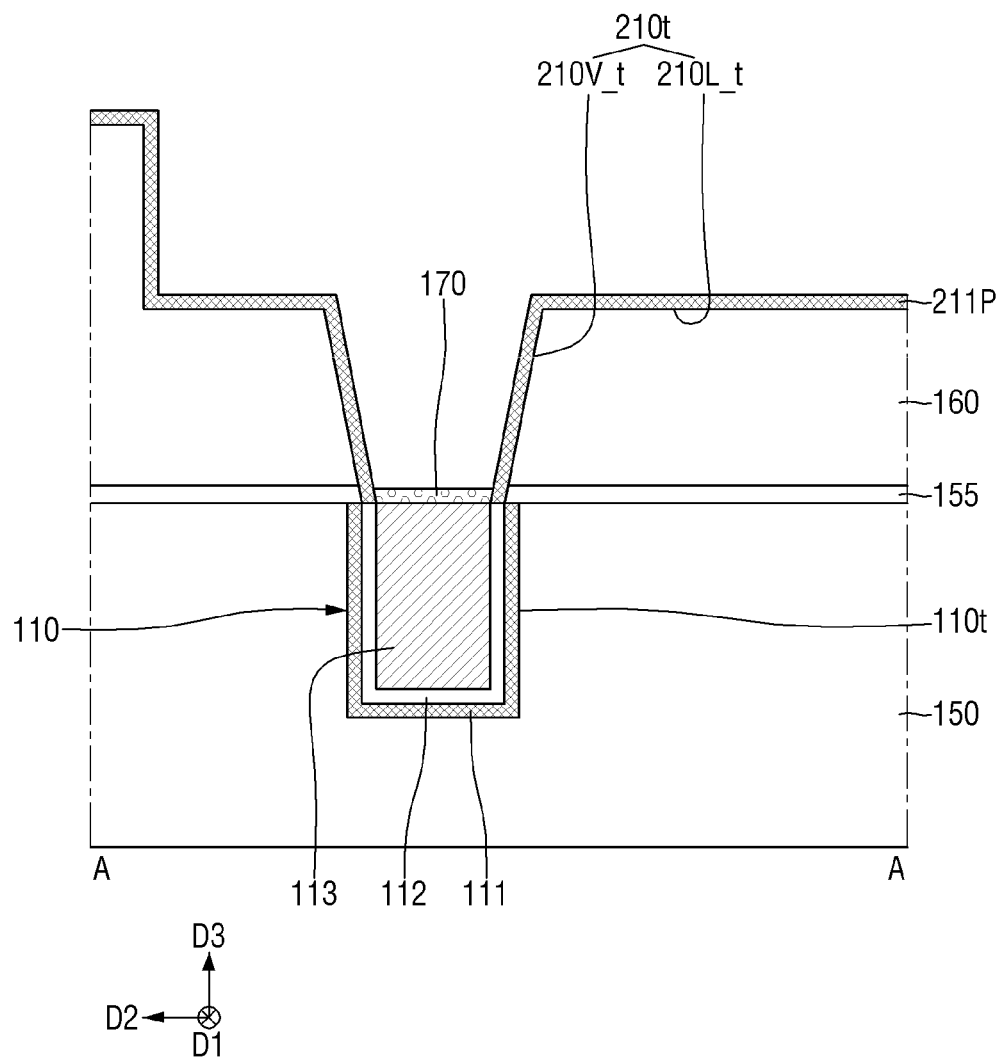

Referring to FIG. 24, responsive to forming the first selective suppression layer 170 or in a state in which the first selective suppression layer 170 is formed, a pre lower barrier layer 211P is formed along a sidewall of the upper wiring trench 210t. The pre lower barrier layer 211P is formed along the upper surface of the second interlayer insulating layer 160.

The pre lower barrier layer 211P is not formed along a bottom surface of the upper wiring trench 210t in which the first selective suppression layer 170 is formed.

However, the pre lower barrier layer 211P may be formed on the entirety of the sidewall of the upper wiring trench 210t. The first selective suppression layer 170 covers a portion of the sidewall of the upper wiring trench 210t, but the pre lower barrier layer 211P may also be formed on the sidewall of the upper wiring trench 210t covered by the first selective suppression layer 170. The pre lower barrier layer 211P is in contact with the lower wiring structure 110.

The pre lower barrier layer 211P is formed using, for example, atomic layer deposition (ALD). The pre lower barrier layer 211P may include metal nitride, for example, tantalum nitride (TaN).

Figure 25:
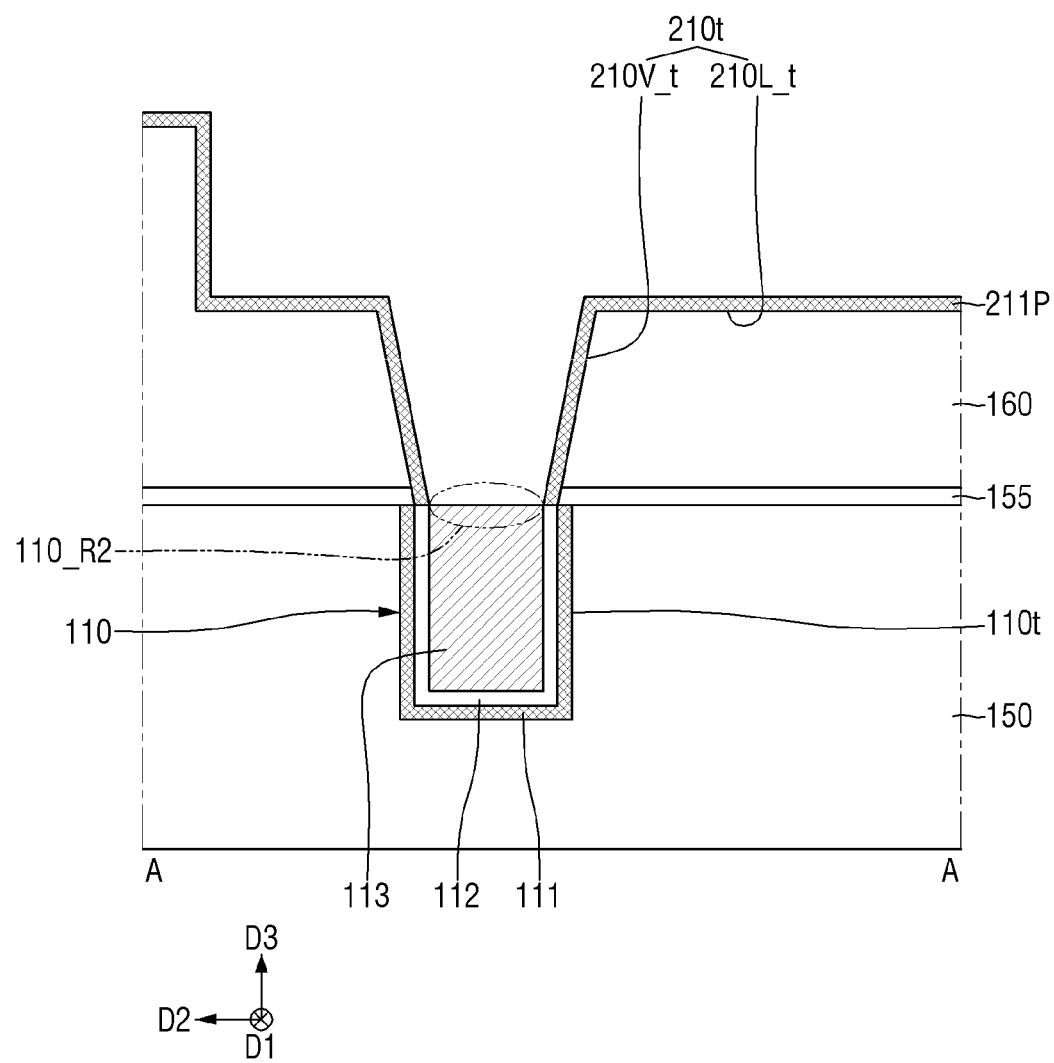
Figure 26:
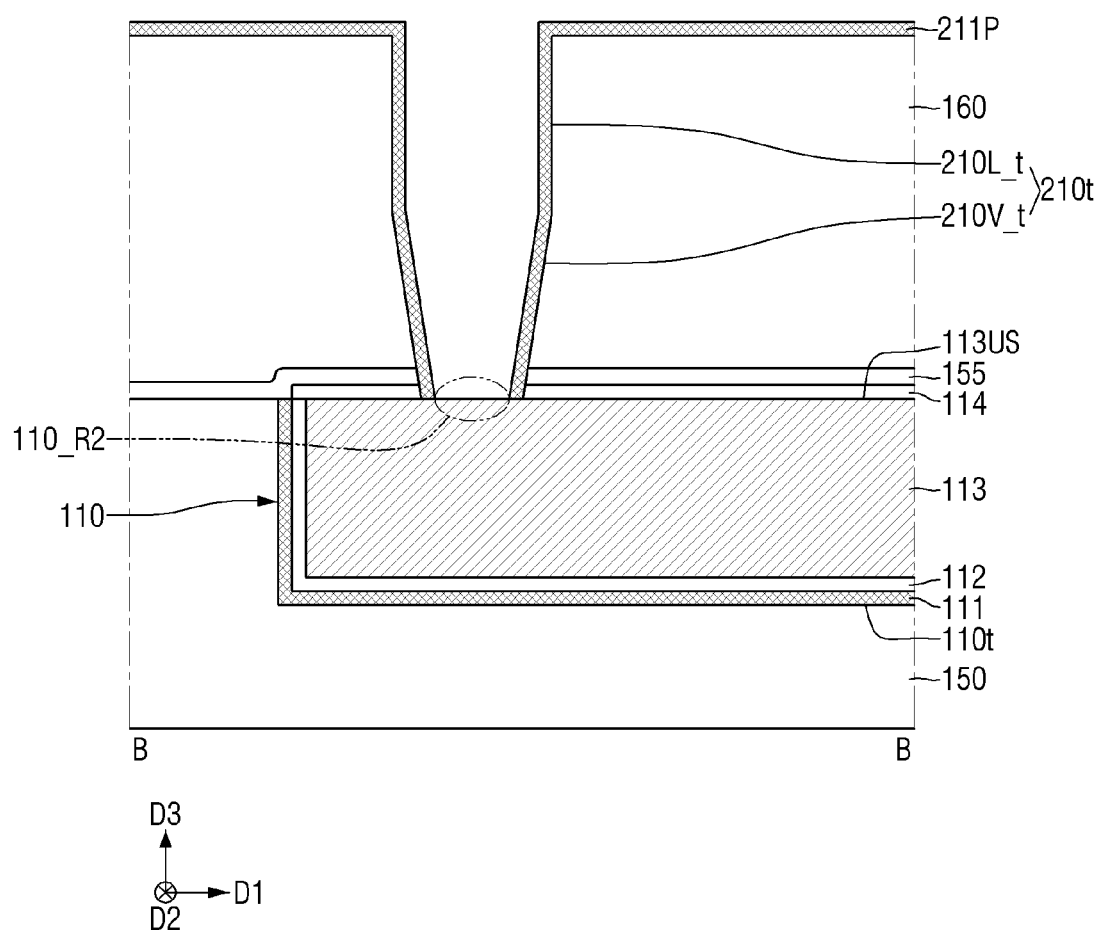

Referring to FIGS. 25 and 26, the second region 110_R2 of the lower wiring structure may be exposed by removing the first selective suppression layer 170.

Since the pre lower barrier layer 211P covers a portion of the first region 110_R1 of the lower wiring structure, the second region 110_R2 of the lower wiring structure may be smaller than the first region 110_R1 of the lower wiring structure.

The first selective suppression layer 170 may be removed through, for example, plasma processing, but is not limited thereto.

Figure 27:
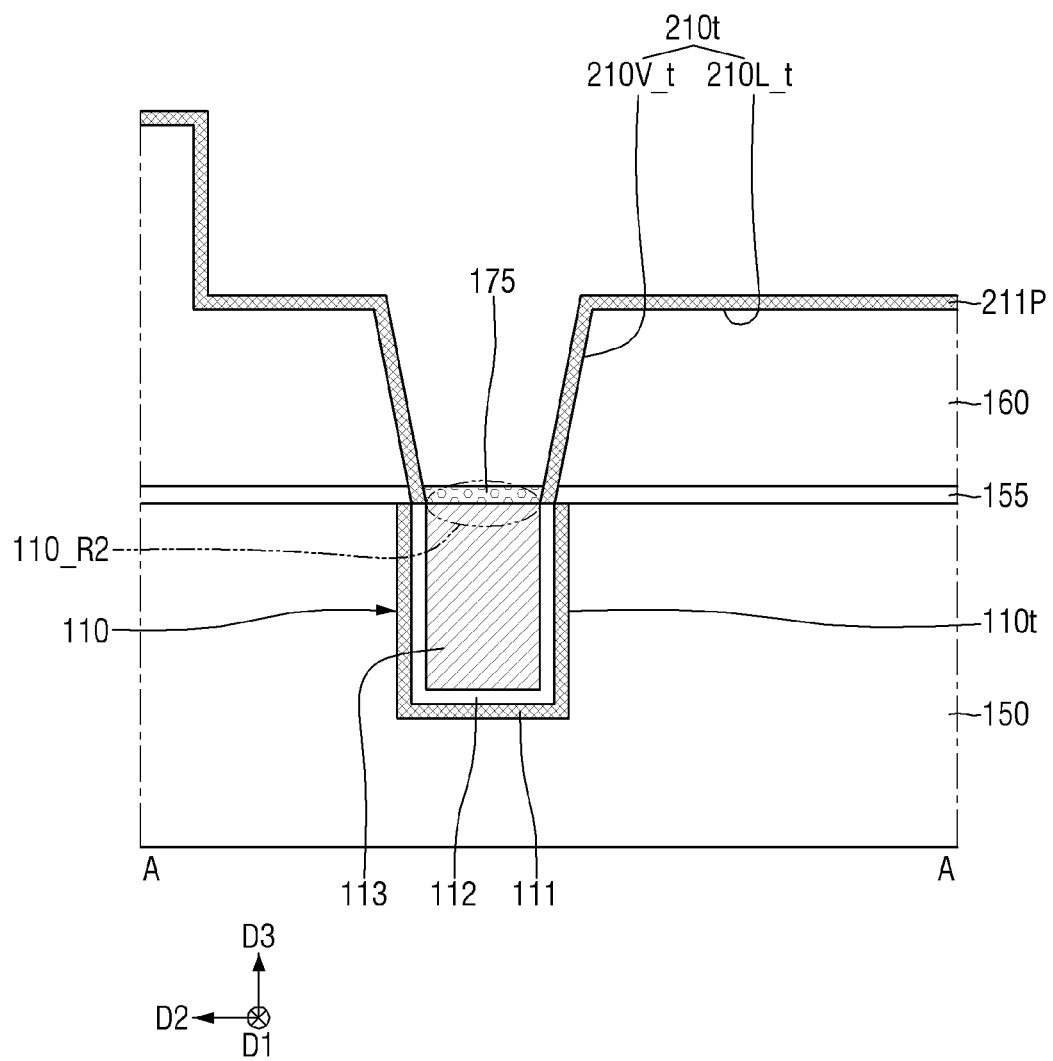

Referring to FIG. 27, the second selective suppression layer 175 is formed on the exposed second region 110_R2 of the lower wiring structure.

A second selective suppression layer 175 includes an organic material. The second selective suppression layer 175 may selectively prevent a conductive material from being deposited on a surface on which the second selective suppression layer 175 is formed.

The second selective suppression layer 175 may be formed on a metal or a metal alloy. The second selective suppression layer 175 is not formed on an insulating material. In addition, the second selective suppression layer 175 is not formed on metal nitride having a dense structure.

Figure 28:
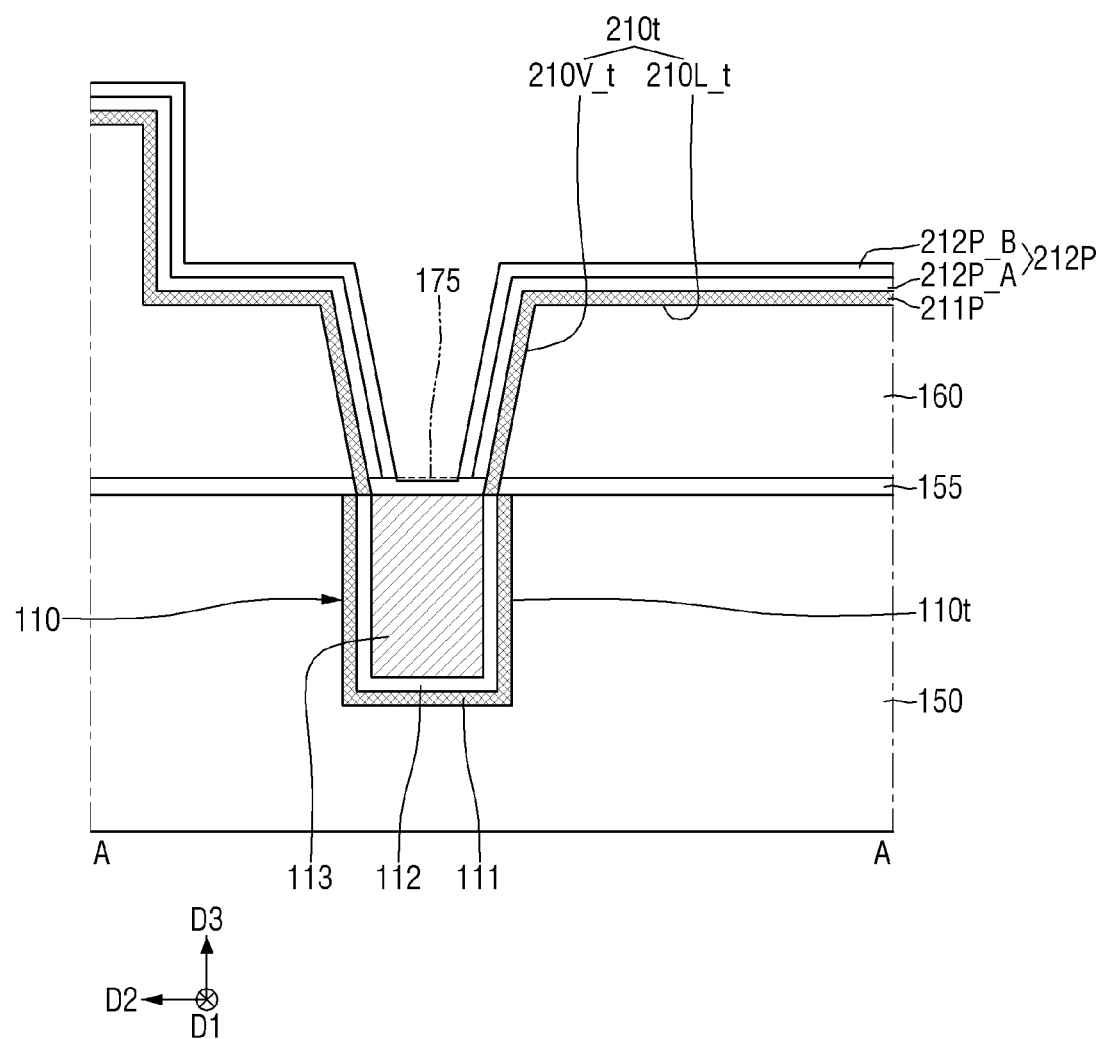

Referring to FIG. 28, responsive to forming the second selective suppression layer 175 or in a state in which the second selective suppression layer 175 is formed, a first pre upper liner 212P_A is formed. The first pre upper liner 212P_A is formed on the pre lower barrier layer 211P.

The first pre upper liner 212P_A is formed along a sidewall of the upper wiring trench 210t. The first pre upper liner 212P_A is formed along the upper surface of the second interlayer insulating layer 160.

The first pre upper liner 212P_A is not formed along a bottom surface of the upper wiring trench 210t in which the second selective suppression layer 175 is formed. In addition, the first pre upper liner 212P_A may not be formed on the sidewall of the upper wiring trench 210t covered by the second selective suppression layer 175. In some embodiments, unlike that illustrated, the first pre upper liner 212P_A may also be formed on the sidewall of the upper wiring trench 210t covered by the second selective suppression layer 175.

The first pre upper liner 212P_A may be, for example, a ruthenium (Ru) layer.

Here, in a state in which the second selective suppression layer 175 is formed, a second pre upper liner 212P_B is formed. The second pre upper liner 212P_B is formed on the first pre upper liner 212P_A.

The second pre upper liner 212P_B is formed along the sidewall and the bottom surface of the upper wiring trench 210t. The second pre upper liner 212P_B is formed along the upper surface of the second interlayer insulating layer 160.

The second pre upper liner 212P_B is formed along the bottom surface of the upper wiring trench 210t in which the second selective suppression layer 175 is formed.

The second pre upper liner 212P_B may be a cobalt (Co) layer.

In a state in which the second selective suppression layer 175 is formed, a pre upper liner 212P is formed along the sidewall and the bottom surface of the upper wiring trench 210t. The pre upper liner 212P includes the first pre upper liner 212P_A and the second pre upper liner 212P_B.

Figure 29:
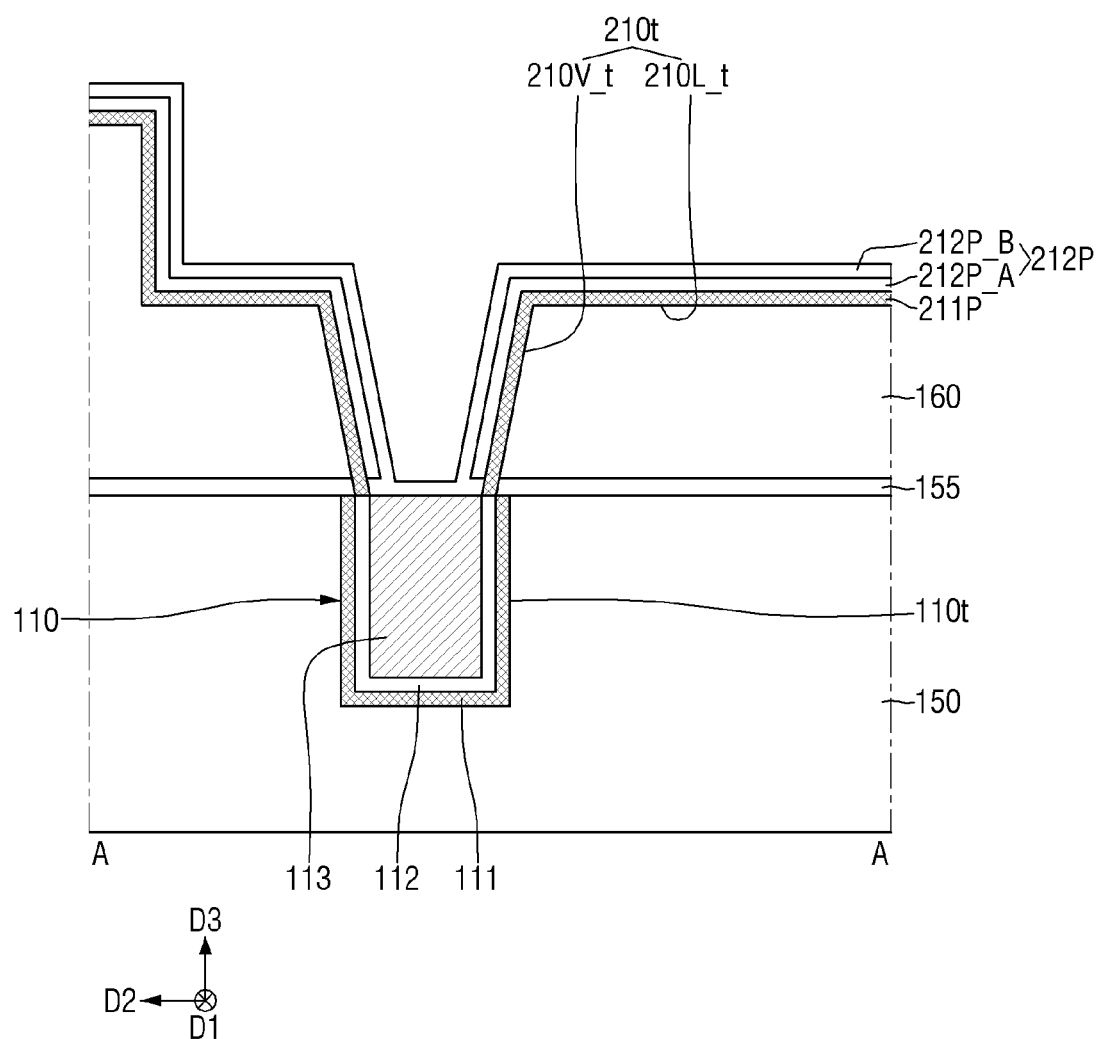

Referring to FIG. 29, the second selective suppression layer 175 is removed.

The second selective suppression layer 175 may be removed through, for example, plasma processing, but is not limited thereto.

Subsequently, referring to FIG. 2, a pre upper filling layer filling the upper wiring trench 210t may be formed on the pre upper liner 212P.

Subsequently, the pre lower barrier layer 211P, the pre upper liner 212P, and the pre upper filling layer disposed on the upper surface of the second interlayer insulating layer 160 may be removed.

For example, while the second pre upper liner 212P_B is formed on the first pre upper liner 212P_A, an alloy reaction between cobalt (Co) and ruthenium (Ru) may proceed.

As another example, while the second selective suppression layer 175 is removed, an alloy reaction between cobalt (Co) and ruthenium (Ru) may proceed.

As still another example, while the pre upper filling layer fills the upper wiring trench 210t, an alloy reaction between cobalt (Co) and ruthenium (Ru) may proceed. When a temperature at which the alloy reaction between cobalt (Co) and ruthenium (Ru) occurs is maintained, the alloy reaction between cobalt (Co) and ruthenium (Ru) may proceed.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:

1. A semiconductor device comprising:
    a lower wiring structure;
    an upper interlayer insulating layer on the lower wiring structure and comprising an upper wiring trench that vertically overlaps a portion of the lower wiring structure; and
    an upper wiring structure comprising an upper liner and an upper filling layer on the upper liner in the upper wiring trench,
    wherein the upper liner comprises a sidewall portion extending along a sidewall of the upper wiring trench and a bottom portion extending along a bottom surface of the upper wiring trench,
    the sidewall portion of the upper liner comprises cobalt (Co) and ruthenium (Ru), and
    the bottom portion of the upper liner is formed of cobalt (Co).

2. The semiconductor device of claim 1, wherein the sidewall portion of the upper liner comprises a first portion formed of cobalt (Co) and ruthenium (Ru) and a second portion formed of cobalt (Co), and
the first portion of the sidewall portion of the upper liner is on the second portion of the sidewall portion of the upper liner.

3. The semiconductor device of claim 1, wherein an entirety of the sidewall portion of the upper liner is formed of cobalt (Co) and ruthenium (Ru), and
the sidewall portion of the upper liner is in contact with the lower wiring structure.

4. The semiconductor device of claim 1, wherein the sidewall portion of the upper liner comprises a ruthenium-cobalt (RuCo) alloy layer.

5. The semiconductor device of claim 4, wherein the sidewall portion of the upper liner further comprises a cobalt (Co) layer extending along a boundary between the ruthenium-cobalt alloy layer and the upper filling layer.

6. The semiconductor device of claim 4, wherein the sidewall portion of the upper liner further comprises a ruthenium (Ru) layer extending along the sidewall of the upper wiring trench, and
the ruthenium-cobalt alloy layer is between the ruthenium layer and the upper filling layer.

7. The semiconductor device of claim 1, wherein the bottom portion of the upper liner is in contact with the lower wiring structure and is free of ruthenium (Ru).

8. The semiconductor device of claim 1, wherein the upper wiring structure further comprises an upper barrier layer extending along the sidewall of the upper wiring trench,
the upper liner is between the upper barrier layer and the upper filling layer,
the upper barrier layer comprises a metal nitride, and
the upper barrier layer does not extend along the bottom surface of the upper wiring trench.

9. The semiconductor device of claim 8, wherein the upper barrier layer is in contact with the lower wiring structure.

10. The semiconductor device of claim 1, wherein the lower wiring structure comprises a lower filling layer and a lower capping layer on the lower filling layer, and
the bottom portion of the upper liner is in contact with the lower capping layer.

11. The semiconductor device of claim 1, wherein the lower wiring structure comprises a lower filling layer and a lower capping layer on the lower filling layer,
an upper surface of the lower filling layer comprises a first region comprising the lower capping layer and a second region free of the lower capping layer, and
the upper wiring structure is in contact with the second region of the upper surface of the lower filling layer.

12. A semiconductor device comprising:
a lower wiring structure;
an upper interlayer insulating layer on the lower wiring structure and comprising an upper wiring trench, the upper wiring trench comprising an upper wiring line trench and an upper via trench on a bottom surface of the upper wiring line trench, wherein a bottom surface of the upper via trench is defined by the lower wiring structure; and
an upper wiring structure comprising an upper barrier layer, an upper filling layer, and an upper liner between the upper barrier layer and the upper filling layer in the upper wiring trench,
wherein the upper barrier layer extends along a sidewall and the bottom surface of the upper wiring line trench and a sidewall of the upper via trench,
the upper barrier layer comprises a metal nitride,
the upper liner comprises a sidewall portion extending along the sidewall and the bottom surface of the upper wiring line trench and along the sidewall of the upper via trench, and a bottom portion extending along the bottom surface of the upper via trench,
the upper liner is in contact with the lower wiring structure,
the upper liner comprises cobalt (Co) and ruthenium (Ru), and
the sidewall portion of the upper liner has a composition different from that of the bottom portion of the upper liner.

13. The semiconductor device of claim 12, wherein the sidewall portion of the upper liner comprises cobalt (Co) and ruthenium (Ru), and
the bottom portion of the upper liner is formed of cobalt (Co).

14. The semiconductor device of claim 12, wherein the sidewall portion of the upper liner comprises a first portion comprising cobalt (Co) and ruthenium (Ru) and a second portion formed of cobalt (Co), and
the second portion of the sidewall portion of the upper liner is in contact with the lower wiring structure.

15. The semiconductor device of claim 12, wherein an entirety of the sidewall portion of the upper liner comprises cobalt (Co) and ruthenium (Ru), and
the sidewall portion of the upper liner is in contact with the lower wiring structure.

16. The semiconductor device of claim 12, wherein the upper barrier layer is in contact with the lower wiring structure, and the bottom portion of the upper liner is free of ruthenium (Ru).

17. A semiconductor device comprising:
a lower wiring structure;
an upper interlayer insulating layer on the lower wiring structure and comprising an upper wiring trench that vertically overlaps a portion of the lower wiring structure; and
an upper wiring structure comprising an upper liner and an upper filling layer on the upper liner in the upper wiring trench,
wherein the upper liner is in contact with the lower wiring structure,
the upper liner comprises a sidewall portion extending along a sidewall of the upper wiring trench and a bottom portion extending along a bottom surface of the upper wiring trench,
the sidewall portion of the upper liner comprises a first portion comprising a ruthenium-cobalt (RuCo) alloy layer, and a second portion formed of cobalt (Co),
the second portion of the sidewall portion of the upper liner is in contact with the lower wiring structure, and
the bottom portion of the upper liner is formed of cobalt (Co).

18. The semiconductor device of claim 17, wherein the upper wiring structure further comprises an upper barrier layer extending along the sidewall of the upper wiring trench,
the upper liner is between the upper barrier layer and the upper filling layer,
the upper barrier layer comprises a tantalum nitride, and
the upper barrier layer is in contact with the lower wiring structure.

19. The semiconductor device of claim 17, further comprising a lower interlayer insulating layer comprising a lower wiring trench, wherein the lower wiring structure comprises:
a lower liner extending along a sidewall of the lower wiring trench and formed of cobalt (Co),
a lower filling layer in the lower wiring trench on the lower liner, and
a lower capping layer on an upper surface of the lower filling layer, in contact with the lower liner, and formed of cobalt (Co).

20. The semiconductor device of claim 17, further comprising a lower interlayer insulating layer comprising a lower wiring trench, wherein the lower wiring structure comprises:
a lower liner extending along a sidewall of the lower wiring trench and comprising cobalt (Co) and ruthenium (Ru),
a lower filling layer in the lower wiring trench on the lower liner, and
a lower capping layer on an upper surface of the lower filling layer, in contact with the lower liner, and formed of cobalt (Co).

* * * * *